United States Patent
Moon et al.

(10) Patent No.: US 10,741,123 B2
(45) Date of Patent: Aug. 11, 2020

(54) GATE DRIVER AND DISPLAY DEVICE INCLUDING THE SAME

(71) Applicant: LG Display Co., Ltd., Seoul (KR)

(72) Inventors: Suhwan Moon, Paju-si (KR); Minho Lee, Paju-si (KR); Daekyu Kim, Paju-si (KR); Yeyeong Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 106 days.

(21) Appl. No.: 16/039,944

(22) Filed: Jul. 19, 2018

(65) Prior Publication Data

US 2019/0189052 A1 Jun. 20, 2019

(30) Foreign Application Priority Data

Dec. 18, 2017 (KR) .................. 10-2017-0174443

(51) Int. Cl.
| | |
|---|---|
| *G09G 3/32* | (2016.01) |
| *G09G 3/20* | (2006.01) |
| *H01L 27/32* | (2006.01) |
| *H01L 27/12* | (2006.01) |
| *G09G 3/3233* | (2016.01) |
| *H01L 51/52* | (2006.01) |
| *G09G 3/3258* | (2016.01) |

(52) U.S. Cl.
CPC ............. *G09G 3/3233* (2013.01); *G09G 3/20* (2013.01); *G09G 3/3258* (2013.01); *H01L 27/1214* (2013.01); *H01L 27/3213* (2013.01); *H01L 27/3276* (2013.01); *H01L 51/5203* (2013.01); *G09G 2310/08* (2013.01)

(58) Field of Classification Search
CPC ......... G09G 3/32; G09G 3/3225–3266; G09G 3/36; G09G 3/3648; G09G 3/3674–3681; G09G 2310/0264; G09G 2310/0267; G09G 2310/0283–0297; G09G 2310/062; G09G 2310/067; G09G 2310/08; G09G 2320/0209–0223; G09G 2330/021; G09G 2340/14; G09G 2350/00; H01L 27/1214; H01L 27/3211–3218; H01L 27/3276; H01L 51/5203

See application file for complete search history.

(56) References Cited

U.S. PATENT DOCUMENTS

| | | | |
|---|---|---|---|
| 2004/0125069 A1* | 7/2004 | Park .................. | G09G 3/3666 345/100 |
| 2013/0083885 A1* | 4/2013 | Lee ................... | G11C 19/28 377/69 |
| 2016/0335962 A1* | 11/2016 | Xiao .................. | G09G 3/36 |

* cited by examiner

*Primary Examiner* — Nathan Danielsen
(74) *Attorney, Agent, or Firm* — Fenwick & West LLP

(57) ABSTRACT

A gate driver and a display device including the same are disclosed. The gate driver includes a plurality of stages. Each stage includes a first transistor outputting a first clock signal as a scan signal in accordance with a first node, a second transistor outputting a gate-off voltage as the scan signal in accordance with a second node which is activated as opposed to the first node, a first controller activating the first node to a gate-on voltage in response to a start signal or a carry signal and a fourth clock signal, and a second controller activating the second node to the gate-on voltage in response to a second clock signal and a third clock signal.

18 Claims, 16 Drawing Sheets

GATE DRIVER AND DISPLAY DEVICE INCLUDING THE SAME

CROSS-REFERENCE TO RELATED APPLICATIONS

This application claims the benefit of Republic of Korea Patent Application No. 10-2017-0174443 filed on Dec. 18, 2017, which is incorporated herein by reference for all purposes in its entirety.

BACKGROUND

Field of Disclosure

The present disclosure relates to a gate driver and a display device including the same.

Discussion of the Related Art

An electroluminescent display is classified into an inorganic electroluminescent display and an organic electroluminescent display depending on a material of an emission layer. An active matrix organic light emitting diode (OLED) display includes a plurality of OLEDs capable of emitting light by themselves and has many advantages of fast response time, high emission efficiency, high luminance, wide viewing angle, and the like.

An OLED display includes pixels arranged in a matrix and adjusts a luminance of the pixels in accordance with gray levels of image data. Each pixel includes an OLED, a driving thin film transistor (TFT) controlling a driving current flowing in the OLED depending on a gate-to-source voltage of the driving TFT, and switching TFTs programming the gate-to-source voltage of the driving TFT in response to a scan signal. The pixel adjusts a display gray level (or a luminance) with an amount of light emitted by the OLED proportional to the driving current.

The OLED display includes a gate driver generating the scan signals. The gate driver sequentially supplies the scan signals to gate lines. The scan signal is supplied to the switching TFT of each pixel through the gate lines and controls a switching operation of the switching TFT.

SUMMARY OF THE DISCLOSURE

A gate driver may be implemented as a gate shift register including a plurality of stages. Each stage outputs a scan signal at a gate-off voltage or a gate-on voltage depending on a voltage of a node Q and a voltage of a node QB. The scan signal of the gate-off voltage is a signal capable of turning off switching TFTs, and the scan signal of the gate-on voltage is a signal capable of turning on the switching TFTs. The scan signal of the gate-on voltage is output to each stage while the node Q is activated, and the scan signal of the gate-off voltage is output to each stage while the node QB is activated.

When the scan signal of the gate-on voltage is output, an initialization operation of pixels can be performed. Because a gate-on voltage period of a scan signal is short in a high resolution display device, the high resolution display device secures an initialization period through an overlap drive. The overlap drive allows gate-on voltage periods of adjacent scan signals to partially overlap one another using clock signals which overlap one another by a predetermined phase.

In order to secure operation stability of the gate driver, the voltage of the node Q and the voltage of the node QB in each stage have to be controlled to be opposite to each other. In other words, the node QB has to be deactivated to the gate-off voltage while the node Q is activated to the gate-on voltage, and the node QB has to be activated to the gate-on voltage while the node Q is deactivated to the gate-off voltage. However, a current path interval, in which the voltage of the node Q and the voltage of the node QB in each stage are not controlled to be opposite to each other, may occur in the overlap drive. In the current path interval, an input terminal of the gate-off voltage and an input terminal of the gate-on voltage are short-circuited to each other, and both the node Q and the node QB are activated to the gate-on voltage. Therefore, a voltage of the scan signal may unstable, and power consumption may increase.

Accordingly, an object of the present disclosure is to address the above-described and other problems and provide a gate driver capable of securing operation stability and operation reliability and reducing power consumption by removing a current path interval, in which a voltage of a node Q and a voltage of a node QB are unstable, and a display device including the gate driver.

In one aspect, there is provided a gate driver comprising a plurality of stages, wherein each stage includes a transistor T6 configured to output a first clock signal as a scan signal in accordance with a node Q, a transistor T7 configured to output a gate-off voltage as the scan signal in accordance with a node QB which is activated as opposed to the node Q, a Q controller configured to activate the node Q to a gate-on voltage in response to a start signal or a carry signal, of which a phase is earlier than a phase of the first clock signal, and a fourth clock signal, of which a phase is earlier than the phase of the first clock signal, and a QB controller configured to activate the node QB to the gate-on voltage in response to a second clock signal, of which a phase is later than the phase of the first clock signal, and a third clock signal, of which a phase is later than the phase of the second clock signal.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Figure 1:
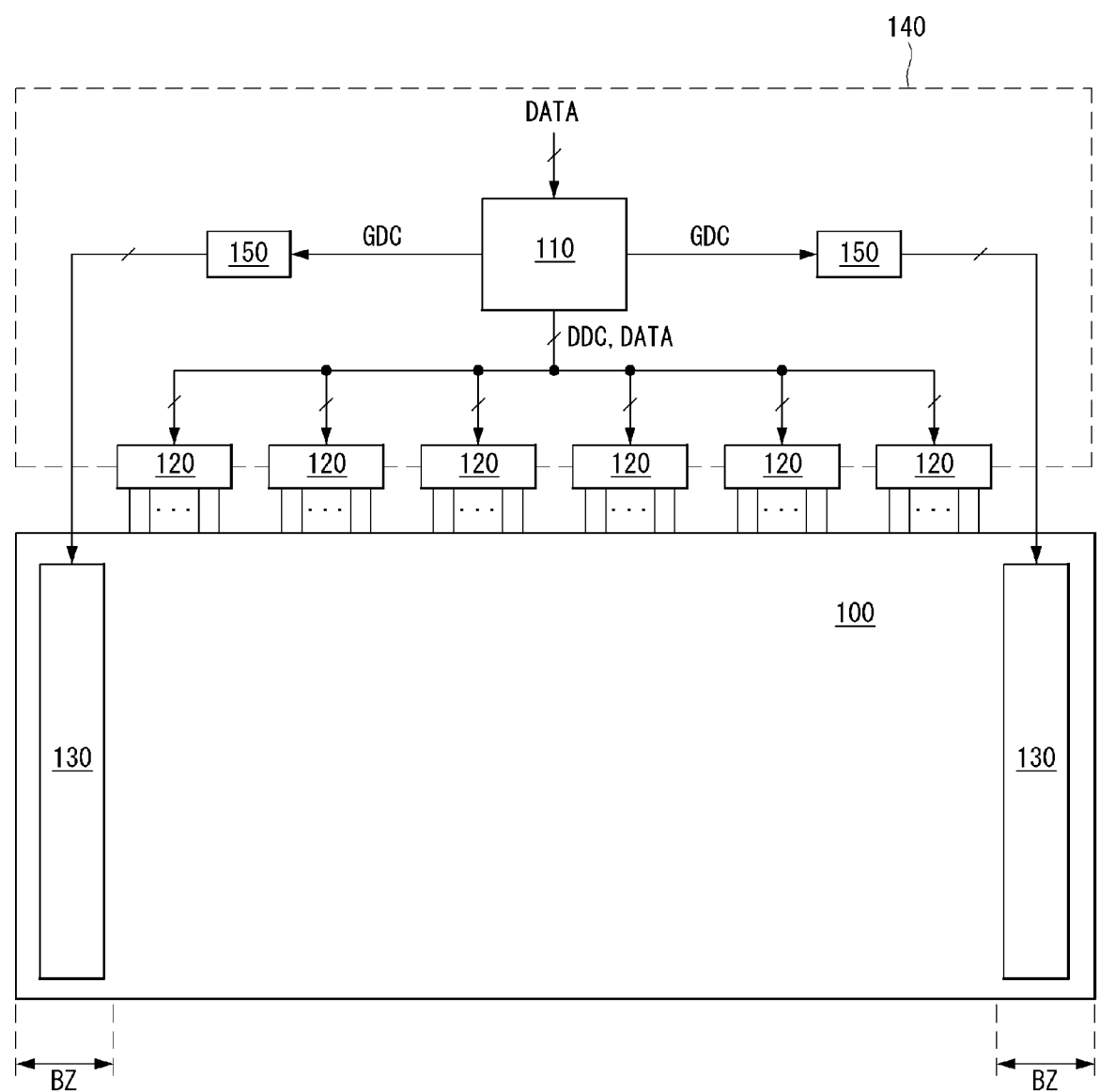
FIG. 1 illustrates a display device according to an embodiment of the disclosure.

Reference will now be made in detail to embodiments of the disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout. In the following description, when a detailed description of certain functions or configurations related to this document that may unnecessarily cloud the gist of the disclosure have been omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component, and vice versa, without departing from the scope of the present disclosure.

In embodiments disclosed herein, each of a pixel circuit and a gate driver on a substrate of a display panel may be implemented as transistors of p-type metal oxide semiconductor field effect transistor (MOSFET) structure. However, embodiments are not limited thereto. The transistor is a three-electrode element including a gate, a source, and a drain. The source is an electrode for supplying carriers to the transistor. The carriers inside the transistor begin to flow from the source. The drain is an electrode from which the carriers exit the transistor. Namely, carriers in the MOSFET flow from the source to the drain. In case of a p-type thin film transistor (TFT) (or p-type MOSFET (PMOS)), because carriers are holes, a source voltage is greater than a drain voltage so that holes can flow from a source to a drain. In the p-type TFT, because holes flow from the source to the drain, a current flows from the source to the drain. It should be noted that the source and the drain of the MOSFET are not fixed. For example, the source and the drain of the MOSFET may be changed depending on an applied voltage. Thus, in embodiments disclosed herein, one of the source and the drain is referred to as a first electrode, and the other is referred to as a second electrode.

The following embodiments are described using an organic light emitting diode (OLED) display including an organic light emitting material as an example of a display device. However, it should be noted that the technical idea of the present disclosure is not limited to the OLED display. For example, the present disclosure may be applied to an inorganic electroluminescent display including an inorganic electroluminescent material.

Figure 2:
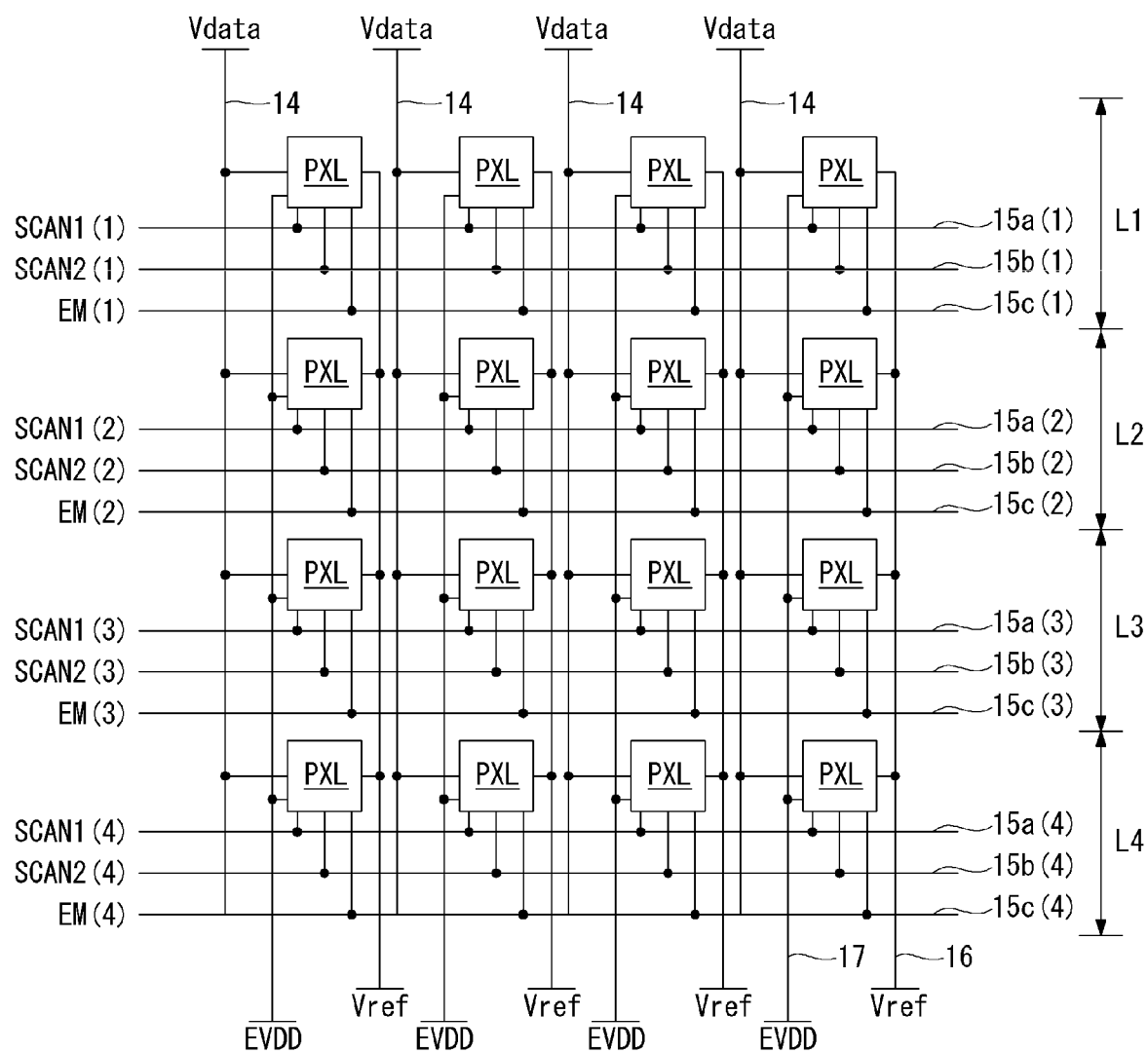
FIG. 2 illustrates a pixel array included in a display panel shown in FIG. 1 according to an embodiment of the disclosure.
Figure 3:
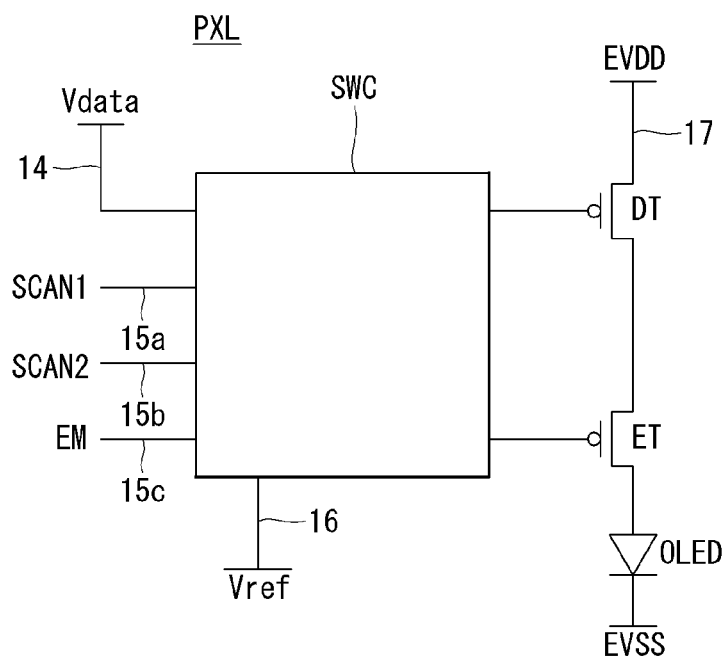
FIG. 3 schematically illustrates a pixel circuit included in a pixel array shown in FIG. 2 according to an embodiment of the disclosure.
Figure 4:
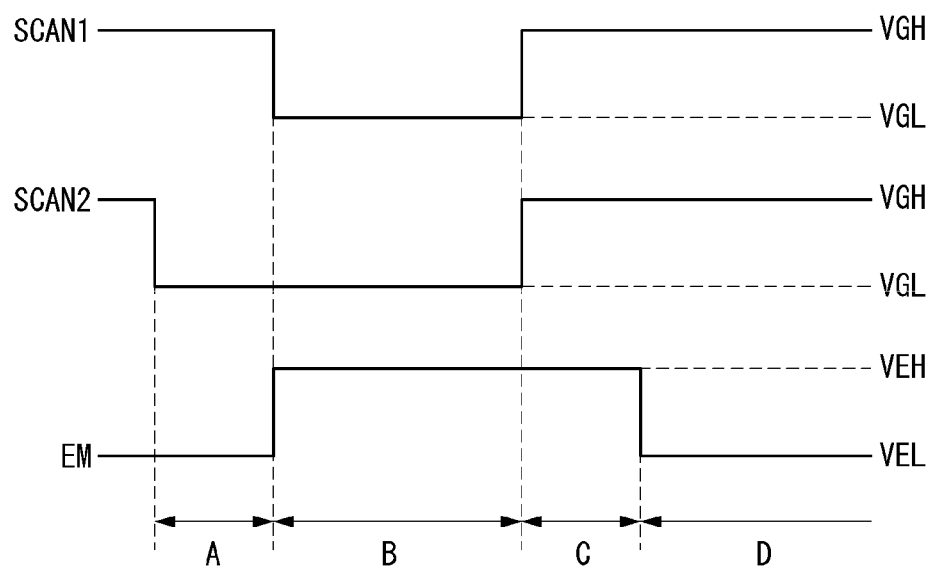
FIG. 4 illustrates a gate signal applied to a pixel circuit shown in FIG. 3 according to an embodiment of the disclosure.
Figure 5:
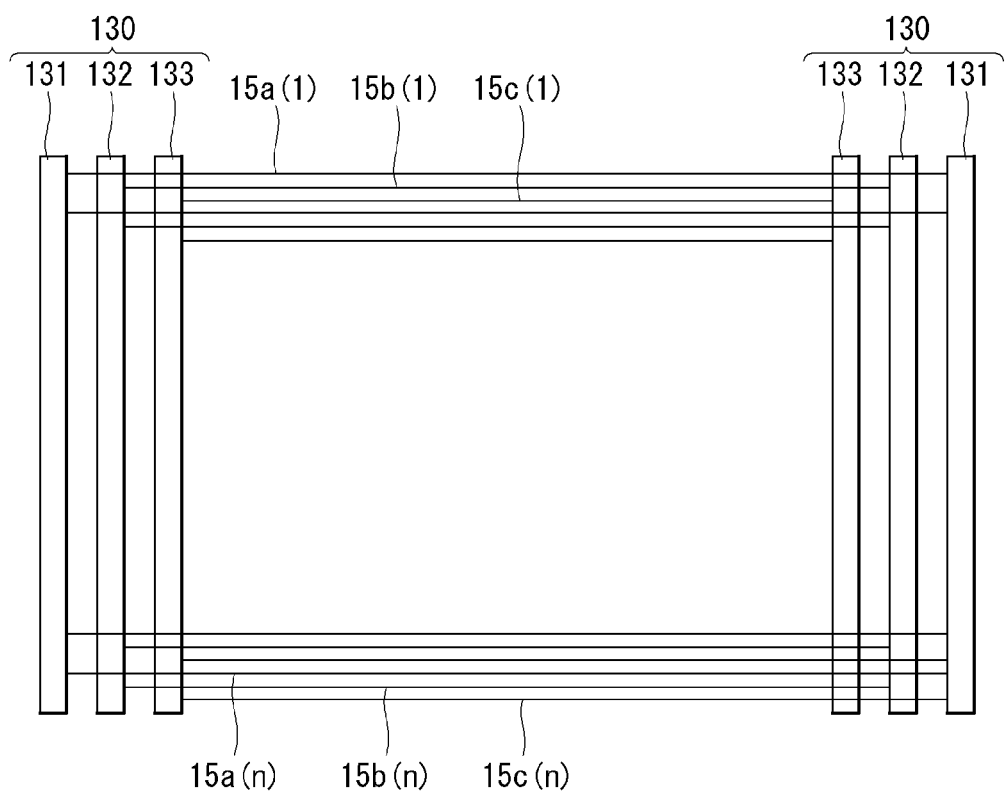
FIG. 5 illustrates first and second scan drivers and an emission driver included in a gate driver shown in FIG. 1 according to an embodiment of the disclosure.

FIG. 1 illustrates a display device according to an embodiment of the disclosure. FIG. 2 illustrates a pixel array included in a display panel shown in FIG. 1 according to an embodiment of the disclosure. FIG. 3 schematically illustrates a pixel circuit included in a pixel array shown in FIG. 2 according to an embodiment of the disclosure. FIG. 4 illustrates a gate signal applied to a pixel circuit shown in FIG. 3 according to an embodiment of the disclosure. FIG. 5 illustrates first and second scan drivers and an emission driver included in a gate driver shown in FIG. 1 according to an embodiment of the disclosure.

Referring to FIG. 1, a display device according to an embodiment of the disclosure includes a display panel 100, a timing controller 110, a data driver 120, a gate driver 130, and a level shifter 150, and the like.

A plurality of data lines 14 and a plurality of gate lines 15a, 15b and 15c are disposed to intersect each other on the display panel 100. Pixels PXL are respectively arranged at intersections of the data lines 14 and the gate lines 15a, 15b and 15c in a matrix to form a pixel array.

As shown in FIG. 2, the pixel array of the display panel 100 includes a plurality of horizontal pixel lines L1 to L4. The pixels PXL, which are horizontally adjacent to one another and are commonly connected to the gate lines 15a, 15b and 15c, are disposed on each of the horizontal pixel lines L1 to L4. In embodiments disclosed herein, each of the horizontal pixel lines L1 to L4 is not a physical signal line but a set of pixels implemented by horizontally adjacent pixels PXL of one line. The pixel array may include first power lines 17 supplying a high potential power voltage EVDD to the pixels PXL and second power lines 16 supplying a reference voltage Vref to the pixels PXL. Further, the pixels PXL may be connected to an input terminal of a low potential power voltage EVSS.

As shown in FIG. 2, each gate line may include a first gate line 15a supplied with a first scan signal SCAN1, a second gate line 15b supplied with a second scan signal SCAN2, and a third gate line 15c supplied with an emission signal EM. The third gate line 15c may be omitted depending on a structure of the pixels PXL.

Each pixel PXL may be one of a red pixel, a green pixel, a blue pixel, and a white pixel. A red pixel, a green pixel, a blue pixel, and a white pixel may constitute a unit pixel and can implement various colors. A color implemented by the unit pixel may be determined depending on an emission rate of the red pixel, the green pixel, the blue pixel, and the white pixel. The white pixel may be omitted. In this instance, the red pixel, the green pixel, and the blue pixel may constitute a unit pixel. Each pixel PXL may be connected to the data line 14, the first gate line 15a, the second gate line 15b, the third gate line 15c, the first power line 17, the second power line 16, and the like.

As shown in FIG. 3, each pixel PXL may include an organic light emitting diode (OLED), a driving thin film transistor (TFT) DT controlling a driving current flowing in the OLED depending on a gate-to-source voltage of the driving TFT DT, and a switch circuit SWC for programming the gate-to-source voltage of the driving TFT DT. Each pixel PXL may further include an emission TFT ET for controlling emission timing of the OLED in response to the emission signal EM, if necessary or desired. The switch circuit SWC may include a plurality of switching TFTs, one or more capacitors, and the like. Configuration of the switch circuit SWC can be variously modified according to model and specification of the product. The TFTs included in each pixel PXL may be implemented as PMOS low-temperature polycrystalline silicon (LTPS) TFTs, and thus each pixel PXL can secure desired response characteristics through the PMOS LTPS TFTs. However, embodiments are not limited thereto. For example, at least one of the TFTs may be implemented as an NMOS oxide TFT having good off-current characteristics, and other TFTs may be implemented as PMOS LTPS TFTs having good response characteristics.

For example, each pixel PXL may be driven in response to a gate signal shown in FIG. 4. In this instance, each pixel PXL may perform an initialization operation, a sampling operation, a holding operation, and an emission operation in response to the first and second scan signals SCAN1 and SCAN2 and the emission signal EM. In an initialization period A, the first scan signal SCAN1 is output at a gate-off voltage VGH, the second scan signal SCAN2 is output at a gate-on voltage VGL, and the emission signal EM is output at a gate-on voltage VEL. In a sampling period B, the first and second scan signals SCAN1 and SCAN2 are output at the gate-on voltage VGL, and the emission signal EM is output at a gate-off voltage VEH. In a holding period C, the first and second scan signals SCAN1 and SCAN2 and the emission signal EM are output at the gate-off voltages VGH and VEH. In an emission period D, the first and second scan signals SCAN1 and SCAN2 are output at the gate-off voltage VGH, and the emission signal EM is output at the gate-on voltage VEL.

During the initialization period A, the switch circuit SWC can initialize specific nodes of the pixel circuit to a reference voltage Vref in response to the second scan signal SCAN2 of the gate-on voltage VGL, in order to secure operation stability. During the sampling period B, the switch circuit SWC can program the gate-to-source voltage of the driving TFT DT based on a data voltage Vdata in response to the first scan signal SCAN1 of the gate-on voltage VGL. Further, during the sampling period B, the switch circuit SWC can sample a threshold voltage of the driving TFT DT in response to the second scan signal SCAN2 of the gate-on voltage VGL and reflect the sampled threshold voltage to the gate-to-source voltage of the driving TFT DT, thereby compensating for change in the threshold voltage of the driving TFT DT. During the holding period C, the gate-to-source voltage of the driving TFT DT set in the sampling period B is held. During the emission period D, a driving current corresponding to the gate-to-source voltage flows between a source and a drain of the driving TFT DT, and the OLED emits light with the driving current. In this instance, the emission TFT ET may be turned on in response to the emission signal EM of the gate-on voltage VEL.

In FIG. 4, the gate-on voltage is a voltage of the gate signal capable of turning on the TFT, and the gate-off voltage is a voltage of the gate signal capable of turning off the TFT. For example, a gate-on voltage in the PMOS is gate low voltages VGL and VEL, and a gate-off voltage in the PMOS is gate high voltages VGH and VEH higher than the gate low voltages VGL and VEL. In FIG. 4, the gate-on voltages VGL and VEL may be equal to or different from each other, and the gate-off voltages VGH and VEH may be equal to or different from each other.

Referring to FIG. 1, the data driver 120 receives image data DATA and a source timing control signal DDC from the timing controller 110. The data driver 120 converts the image data DATA into gamma compensation voltages in response to the source timing control signal DDC received from the timing controller 110 and generates data voltages Vdata. The data driver 120 synchronizes the data voltage Vdata with the scan signal SCAN and supplies the data voltage Vdata to the data lines 14 of the display panel 100. The data driver 120 may be connected to the data lines 14 of the display panel 100 through a chip-on glass (COG) process or a tape automated bonding (TAB) process.

Referring to FIG. 1, the level shifter 150 boosts a transistor-transistor logic (TTL) level voltage of a gate timing control signal GDC received from the timing controller 110 to the gate-on voltages VGL and VEL and the gate-off voltages VGH and VEH capable of driving the TFTs of the display panel 100 and supplies them to the gate driver 130. The gate timing control signal GDC may include a start signal, a clock signal, and the like.

Referring to FIG. 1, the gate driver 130 operates in response to the gate timing control signal GDC received from the level shifter 150 and generates the gate signals. The gate driver 130 sequentially supplies the gate signals to the gate lines. The gate driver 130 may be directly formed on a lower substrate of the display panel 100 using a gate driver-in panel (GIP) manner. The gate driver 130 may be formed in a non-display area (i.e., a bezel area BZ) outside a screen of the display panel 100. In the GIP manner, the level shifter 150 may be mounted on a printed circuit board (PCB) 140 together with the timing controller 110.

As shown in FIG. 5, the gate drivers 130 are disposed on opposite sides of the display panel 100 in a double bank structure and supply the scan signals in a double feeding manner, thereby reducing signal distortion resulting from a load variation of each gate line. The gate driver 130 includes a first scan driver 131 generating the first scan signal SCAN1, a second scan driver 132 generating the second scan signal SCAN2, and an emission driver 133 generating the emission signal EM.

The first scan driver 131 may supply the first scan signals SCAN1 to first gate lines 15a(1) to 15a(n) in a line sequential manner. The second scan driver 132 may supply the second scan signals SCAN2 to second gate lines 15b(1) to 15b(n) in a line sequential manner. The emission driver 133 may supply the emission signals EM to third gate lines 15c(1) to 15c(n) in a line sequential manner. The first and second scan drivers 131 and 132 may be implemented as a gate shift register including a plurality of stages. Each stage may be implemented as shown in FIGS. 7 to 10, in order to secure operation stability and operation reliability and reduce power consumption by removing a current path interval, in which a voltage of a node Q and a voltage of a node QB are unstable.

Referring to FIG. 1, the timing controller 110 may be connected to an external host system through known various interface manners. The timing controller 110 receives the image data DATA from the host system. The timing controller 110 may correct the image data DATA and then transmit the corrected image data DATA to the data driver 120, so that a luminance variation resulting from a difference between electrical characteristics of the pixels PXL is compensated.

The timing controller 110 receives timing signals such as a vertical sync signal Vsync, a horizontal sync signal Hsync, a data enable signal DE, and a main clock MCLK from the host system. The timing controller 110 may generate the gate timing control signal GDC and the source timing control signal DDC based on the timing signals.

Figure 6:
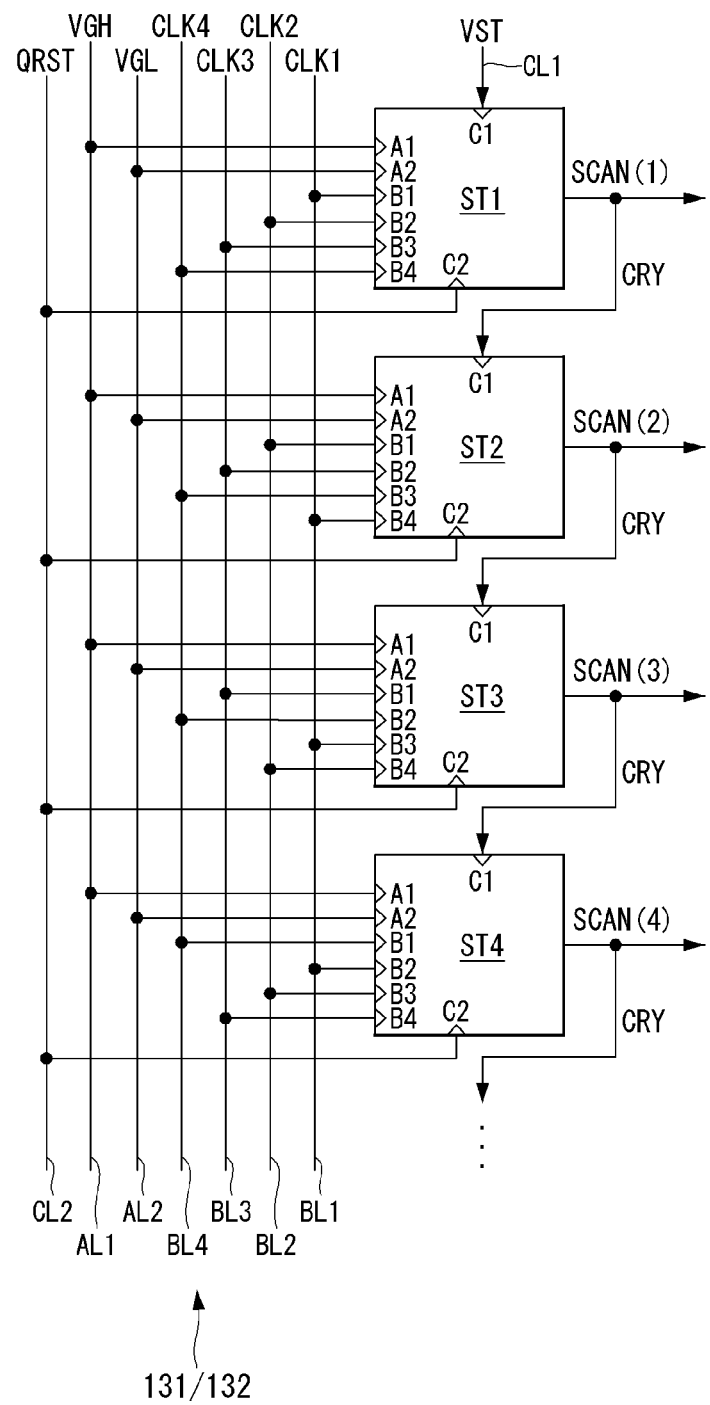
FIG. 6 illustrates a gate shift register included in a first scan driver or a second scan driver shown in FIG. 5 according to an embodiment of the disclosure.

FIG. 6 illustrates a gate shift register included in a first scan driver or a second scan driver shown in FIG. 5 according to an embodiment of the disclosure.

Each of the first scan driver 131 and the second scan driver 132 of FIG. 5 may be implemented as a gate shift register shown in FIG. 6. A plurality of stages ST1 to ST4, . . . for implementing the gate shift register may be GIP elements directly formed in the bezel area BZ of the display panel 100.

Operations of the stages ST1 to ST4, . . . are sequentially activated and sequentially output scan signals SCAN(1) to SCAN(4), . . . . The scan signals SCAN(1) to SCAN(4), . . . may be the first scan signal SCAN1 or the second scan signal SCAN2 of FIG. 4.

The operations of the stages ST1 to ST4, . . . are activated in response to a start signal VST or a carry signal CRY and sequentially output the scan signals SCAN(1) to SCAN(4), . . . . An operation of the uppermost stage ST1 is first activated in response to the start signal VST, and operations of the second uppermost stage ST2 below the uppermost stage ST1 to a lowermost stage are sequentially activated in response to the carry signal CRY received from a previous stage. The carry signal CRY is the scan signal of the previous stage. In embodiments disclosed herein, "previous stage" is a stage that is activated earlier than a reference stage and generates a scan signal of which a phase is earlier than a phase of a scan signal output from the reference stage.

The stages ST1 to ST4, . . . may receive the start signal VST, the carry signal CRY, and a plurality of clock signals CLK1 to CLK4, in order to output the scan signals SCAN(1) to SCAN(4), . . . swinging between the gate-off voltage VGH and the gate-on voltage VGL. The start signal VST and the clock signals CLK1 to CLK4 swing between the gate-off voltage VGH and the gate-on voltage VGL.

The stages ST1 to ST4, . . . may be connected to power lines AL1 and AL2, clock lines BL1 to BL4, and signal lines CL1 and CL2 through a plurality of connection terminals. The stages ST1 to ST4, . . . may be commonly connected to the signal line CL2, the power lines AL1 and AL2, and the clock lines BL1 to BL4. The signal line CL1 may be connected to only the uppermost stage ST1 that is first operated. Thus, the start signal VST may be input to the uppermost stage ST1 through the signal line CL1, and the clock signals CLK1 to CLK4 may be input to all the stages ST1 to ST4, . . . through the clock lines BL1 to BL4. Further, a global reset signal QRST may be input to all the stages ST1 to ST4, . . . through the signal line CL2.

To this end, each of the stages ST1 to ST4, . . . includes a first clock terminal B1 receiving a first clock signal so that the stage is synchronized with the scan signal, a fourth clock terminal B4 receiving a fourth clock signal so that the stage is synchronized with the start signal VST (or the carry signal CRY) of which a phase is earlier than a phase of the scan signal, a second clock terminal B2 receiving a second clock signal of which a phase is later than the phase of the scan signal, and a third clock terminal B3 receiving a third clock signal of which a phase is later than a phase of the second clock signal. Each of the stages ST1 to ST4, . . . further includes a start terminal C1 receiving the start signal VST or the carry signal CRY, a reset terminal C2 receiving the global reset signal QRST, a first power terminal A1 receiving the gate-off voltage VGH, and a second power terminal A2 receiving the gate-on voltage VGL.

The first to fourth clock signals may be determined among the clock signals CLK1 to CLK4. For an overlap drive, gate-on voltage periods of the clock signals CLK1 to CLK4 may overlap one another by a predetermined phase. The clock line BL1 is supplied with the clock signal CLK1 configured such that a phase is later than a phase of the clock signal CLK4 and a gate-on voltage period partially overlaps a gate-on voltage period of the clock signal CLK4. The clock line BL2 is supplied with the clock signal CLK2 configured such that a phase is later than a phase of the clock signal CLK1 and a gate-on voltage period partially overlaps a gate-on voltage period of the clock signal CLK1. The clock line BL3 is supplied with the clock signal CLK3 configured such that a phase is later than a phase of the clock signal CLK2 and a gate-on voltage period partially overlaps a gate-on voltage period of the clock signal CLK2. The clock line BL4 is supplied with the clock signal CLK4 configured such that a phase is earlier than a phase of the clock signal CLK1 and the clock signal CLK4 is synchronized with the start signal VST or the carry signal CRY.

In this instance, there is a difference in determining the first to fourth clock signals between the four adjacent stages ST1 to ST4. For example, the first to fourth clock signals in the first stage ST1 may be sequentially the clock signals CLK1, CLK2, CLK3, and CLK4; the first to fourth clock signals in the second stage ST2 may be sequentially the clock signals CLK2, CLK3, CLK4, and CLK1; the first to fourth clock signals in the third stage ST3 may be sequentially the clock signals CLK3, CLK4, CLK1, and CLK2; and the first to fourth clock signals in the fourth stage ST4 may be sequentially the clock signals CLK4, CLK1, CLK2, and CLK3.

Figure 7:
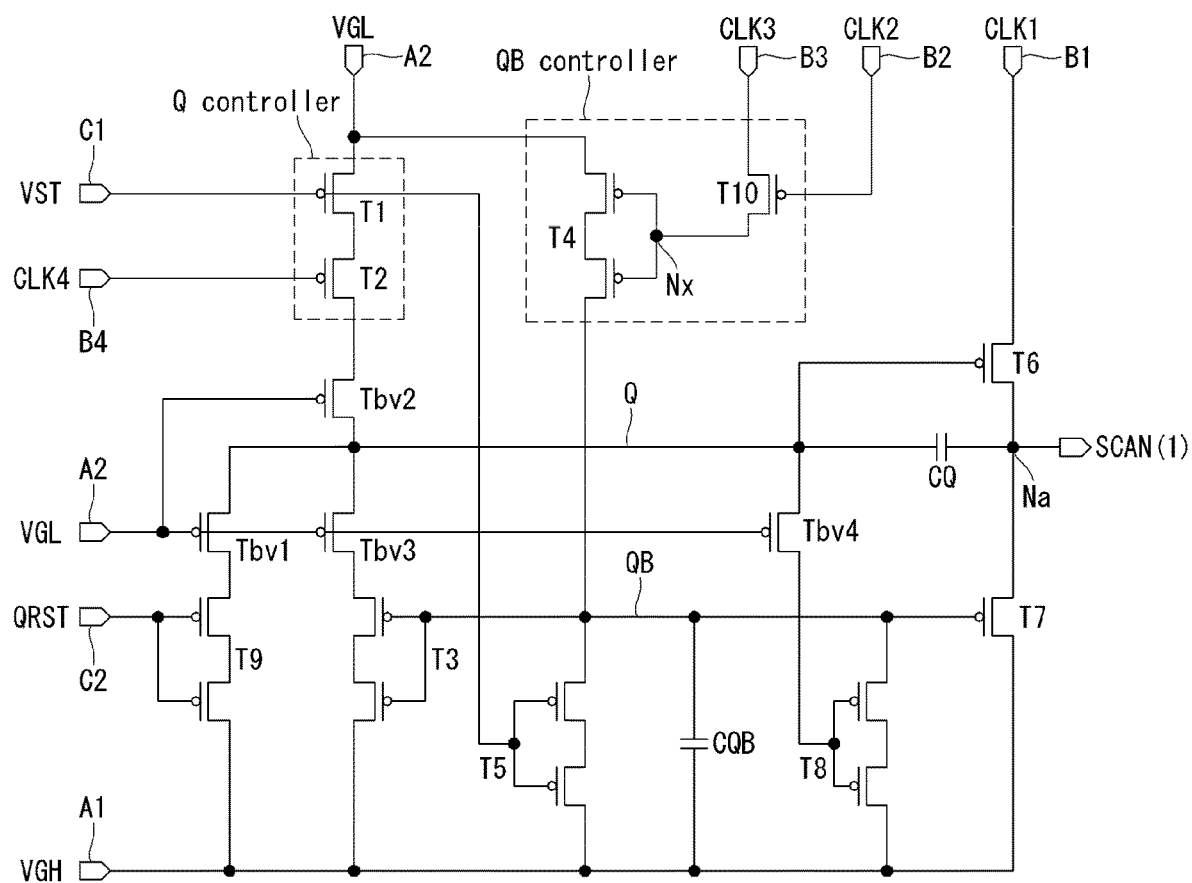
FIGS. 7 to 10 illustrate various connection configurations of a stage shown in FIG. 6 according to an embodiment of the disclosure.

FIG. 7 illustrates connection configuration of the stage shown in FIG. 6 according to an embodiment of the disclosure. More specifically, FIG. 7 illustrates the uppermost stage ST1 shown in FIG. 6. Configuration of each of the remaining stages ST2, ST3, ST4, . . . of FIG. 6 may be substantially the same as configuration of the uppermost stage ST1 of FIG. 7, except a difference in the clock signals and the carry signal.

Referring to FIG. 7, the stage ST1 may include a reset unit, an output buffer, a Q controller, a QB controller, and a deterioration reducing unit. The deterioration reducing unit is used to further improve the operation stability and thus may be omitted.

Figure 11:
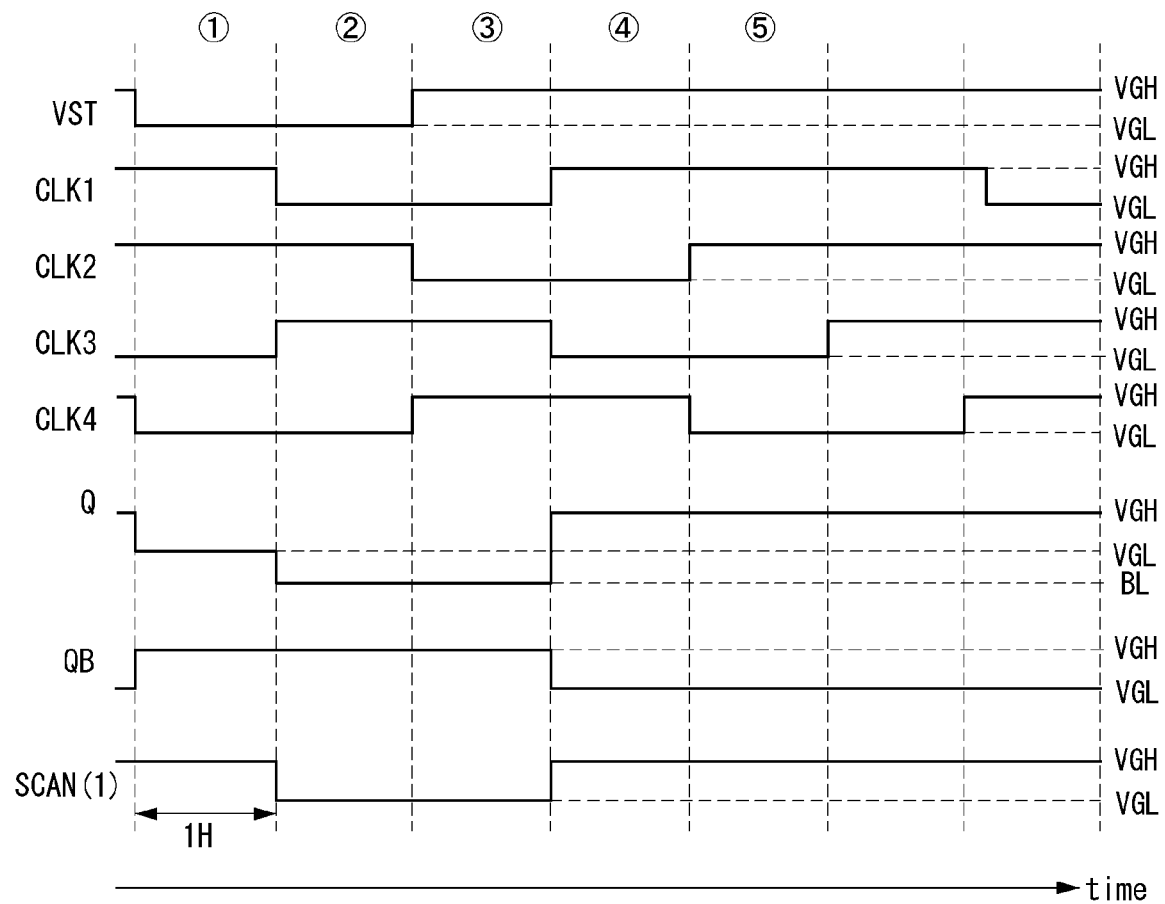
FIG. 11 illustrates an operation waveform of a stage in accordance with an overlap drive according to an embodiment of the disclosure.

In the clock signals CLK1 to CLK4 input to the stage ST1, as shown in FIG. 11, gate-on voltage periods of the first and second clock signals CLK1 and CLK2 may partially overlap; gate-on voltage periods of the second and third clock signals CLK2 and CLK3 may partially overlap; gate-on voltage periods of the third and fourth clock signals CLK3 and CLK4 may partially overlap; and gate-on voltage periods of the fourth and first clock signals CLK4 and CLK1 may partially overlap. Further, the gate-on voltage periods of the first and third clock signals CLK1 and CLK3 may not overlap, and the gate-on voltage periods of the second and fourth clock signals CLK2 and CLK4 may not overlap. A reason why the clock signals CLK1 to CLK4 are configured as described above is to perform the overlap drive.

The reset unit may be implemented as a transistor T9 that is switched in response to the global reset signal QRST. The transistor T9 resets the node Q to the gate-off voltage VGH when the global reset signal QRST is input at the gate-on voltage VGL, thereby securing the operation stability and the operation reliability of the stage. A gate electrode of the transistor T9 is connected to a reset terminal C2. The global reset signal QRST of the gate-on voltage VGL may be input to all the stages in a power-on period of an initial drive. The global reset signal QRST of the gate-on voltage VGL may be input in the initial drive before the start signal VST.

The output buffer may include a transistor T6 controlled according to the node Q, a transistor T7 controlled according to the node QB, and a boosting capacitor CQ connected to the node Q.

The transistor T6 is a pull-up element that outputs the clock signal CLK1, as the scan signal SCAN(1), in accordance with the node Q. A gate electrode of the transistor T6 is connected to the node Q, a first electrode of the transistor T6 is connected to the clock terminal B1, and a second electrode of the transistor T6 is connected to a node Na.

The boosting capacitor CQ is connected between the node Q and the node Na. When the clock signal CLK1 is inverted from the gate-off voltage VGH to the gate-on voltage VGL, a voltage of the node Q is reduced from the gate-on voltage VGL to a boosting voltage level lower than the gate-on voltage VGL due to a coupling effect of the boosting capacitor CQ and the node Q. Due to such a bootstrapping effect, a voltage of the node Na is rapidly changed to the gate-on voltage VGL. The scan signal SCAN(1) of the gate-on voltage VGL can be rapidly output using the bootstrapping effect without the distortion or the delay.

The transistor T7 is a pull-down element that outputs the gate-off voltage VGH, as the scan signal SCAN(1), in accordance with the node QB which is activated as opposed to the node Q. A gate electrode of the transistor T7 is connected to the node QB, a first electrode of the transistor T7 is connected to the power terminal A1, and a second electrode of the transistor T7 is connected to the node Na.

The Q controller may include transistors T1, T2, and T3 controlling the voltage of the node Q.

The transistors T1 and T2 are connected in series between the power terminal A2 and the node Q. The transistors T1 and T2 are switched in response to the start signal VST, of which a phase is earlier than a phase of the clock signal CLK1, and the clock signal CLK4 and activate the node Q to the gate-on voltage VGL. Thus, the clock signal CLK4 is a Q activation clock signal for activating the node Q. A gate electrode of the transistor T1 is connected to the start terminal C1 to which the start signal VST is input, a first electrode of the transistor T1 is connected to the power terminal A2, and a second electrode of the transistor T1 is connected to a first electrode of the transistor T2. A gate electrode of the transistor T2 is connected to the clock terminal B4 to which the clock signal CLK4 is input, the first electrode of the transistor T2 is connected to the second electrode of the transistor T1, and a second electrode of the transistor T2 is connected to the node Q via a transistor Tbv2.

The transistor T3 deactivates the node Q to the gate-off voltage VGH while the node QB is activated. A gate electrode of the transistor T3 is connected to the node QB, a first electrode of the transistor T3 is connected to the power terminal A1, and a second electrode of the transistor T3 is connected to the node Q via a transistor Tbv3.

The QB controller may include transistors T4, T5, T8, and T10 controlling a voltage of the node QB and a capacitor CQB.

The QB controller controls turn-on timing of a transistor T4 in response to the two clock signals CLK2 and CLK3 in the overlap drive, thereby removing a current path interval in which the voltage of the node Q and the voltage of the node QB are unstable. Thus, the clock signals CLK2 and CLK3 are QB activation clock signals for activating the node QB. To this end, the QB controller includes the transistor T10 connected to a gate electrode of the transistor T4. The transistor T4 controls a current flow between the power terminal A2 and the node QB in response to the clock signal CLK3 applied to a node Nx. The gate electrode of the transistor T4 is connected to the node Nx, a first electrode of the transistor T4 is connected to the power terminal A2, and a second electrode of the transistor T4 is connected to the node QB. The transistor T10 applies the clock signal CLK3 to the node Nx in response to the clock signal CLK2. A gate electrode of the transistor T10 is connected to the clock terminal B2, a first electrode of the transistor T10 is connected to the clock terminal B3, and a second electrode of the transistor T10 is connected to the node Nx.

As described above, the QB controller further receives the clock signal CLK2 in addition to the clock signal CLK3 and is operated. In this instance, as shown in FIG. 11, because the gate-on voltage period of the clock signal CLK2 partially overlaps the gate-on voltage period of the clock signal CLK3 and does not overlap the gate-on voltage period of the clock signal CLK4 controlling turn-on timing of the transistor T2, the current path interval, in which both the node Q and the node QB are simultaneously activated to the gate-on voltage VGL, can be removed.

The transistor T5 is switched in response to the start signal VST and deactivates the node QB to the gate-off voltage VGH. A gate electrode of the transistor T5 is connected to the start terminal C1, a first electrode of the transistor T5 is connected to the power terminal A1, and a second electrode of the transistor T5 is connected to the node QB.

The transistor T8 deactivates the node QB to the gate-off voltage VGH while the node Q is activated. A gate electrode of the transistor T8 is connected to the node Q via a transistor Tbv4, a first electrode of the transistor T8 is connected to the power terminal A1, and a second electrode of the transistor T8 is connected to the node QB.

The capacitor CQB is connected between the node QB and the power terminal A1 and stabilizes the voltage of the node QB while the node QB is floated.

The deterioration reducing unit includes the transistors Tbv1, Tbv2, Tbv3, and Tbv4 of which gate electrodes are connected to the power terminal A2. One electrode of each of the transistors Tbv1, Tbv2, Tbv3, and Tbv4 is connected to the node Q. The transistors Tbv1, Tbv2, Tbv3, and Tbv4 maintain a turn-on state due to the gate-on voltage VGL of the power terminal A2. However, a gate-to-source voltage of each of the transistors Tbv1, Tbv2, Tbv3, and Tbv4 is less than a threshold voltage while the voltage of the node Q is boosted due to the bootstrapping. Therefore, in this instance, the transistors Tbv1, Tbv2, Tbv3, and Tbv4 are turned off.

The transistor Tbv1 controls a current path between the node Q and the transistor T9. The transistor Tbv1 maintains a turn-on state and is turned off only while the voltage of the node Q is boosted, thereby blocking current between the node Q and the transistor T9. Even when the voltage of the node Q is boosted, the boosting voltage of the node Q does not affect one electrode of the transistor T9. Therefore, an increase in a drain-to-source voltage of the transistor T9 resulting from the boosting voltage of the node Q is prevented. If the drain-to-source voltage of the transistor T9 increases to a value equal to or greater than a critical value, a device breakdown phenomenon, so-called, a breakdown phenomenon may occur due to an overload. Thus, the transistor Tbv1 can prevent the breakdown phenomenon.

The transistor Tbv2 controls a current path between the node Q and the transistor T2. The transistor Tbv2 maintains a turn-on state and is turned off only while the voltage of the node Q is boosted, thereby blocking current between the node Q and the transistor T2. Even when the voltage of the node Q is boosted, the boosting voltage of the node Q does not affect one electrode of the transistor T2. Thus, the transistor Tbv2 can prevent the breakdown phenomenon caused when a drain-to-source voltage of the transistor T2 exceeds a critical value due to the boosting voltage of the node Q.

The transistor Tbv3 controls a current path between the node Q and the transistor T3. The transistor Tbv3 maintains a turn-on state and is turned off only while the voltage of the node Q is boosted, thereby blocking current between the node Q and the transistor T3. Even when the voltage of the node Q is boosted, the boosting voltage of the node Q does not affect one electrode of the transistor T3. Thus, the transistor Tbv3 can prevent the breakdown phenomenon caused when a drain-to-source voltage of the transistor T3 exceeds a critical value due to the boosting voltage of the node Q.

The transistor Tbv4 controls a current path between the node Q and the transistor T8. The transistor Tbv4 maintains a turn-on state and is turned off only while the voltage of the node Q is boosted, thereby blocking current between the node Q and the transistor T8. Even when the voltage of the node Q is boosted, the boosting voltage of the node Q does not affect the gate electrode of the transistor T8. Thus, the transistor Tbv4 can prevent the breakdown phenomenon caused when a gate-to-drain voltage of the transistor T8 exceeds a critical value due to the boosting voltage of the node Q.

The transistors T3, T4, T5, T8, and T9 may be configured in a dual gate structure, so that they can suppress a leakage current when they are turned off. In the dual gate structure, two gate electrodes are connected to each other so that they have the same voltage level. A channel length of the dual gate structure is longer than a channel length of a single gate structure. Because an increase in the channel length results in an increase in a resistance, a leakage current decreases when the transistor is turned off. Hence, the operation stability can be secured.

Figure 8:
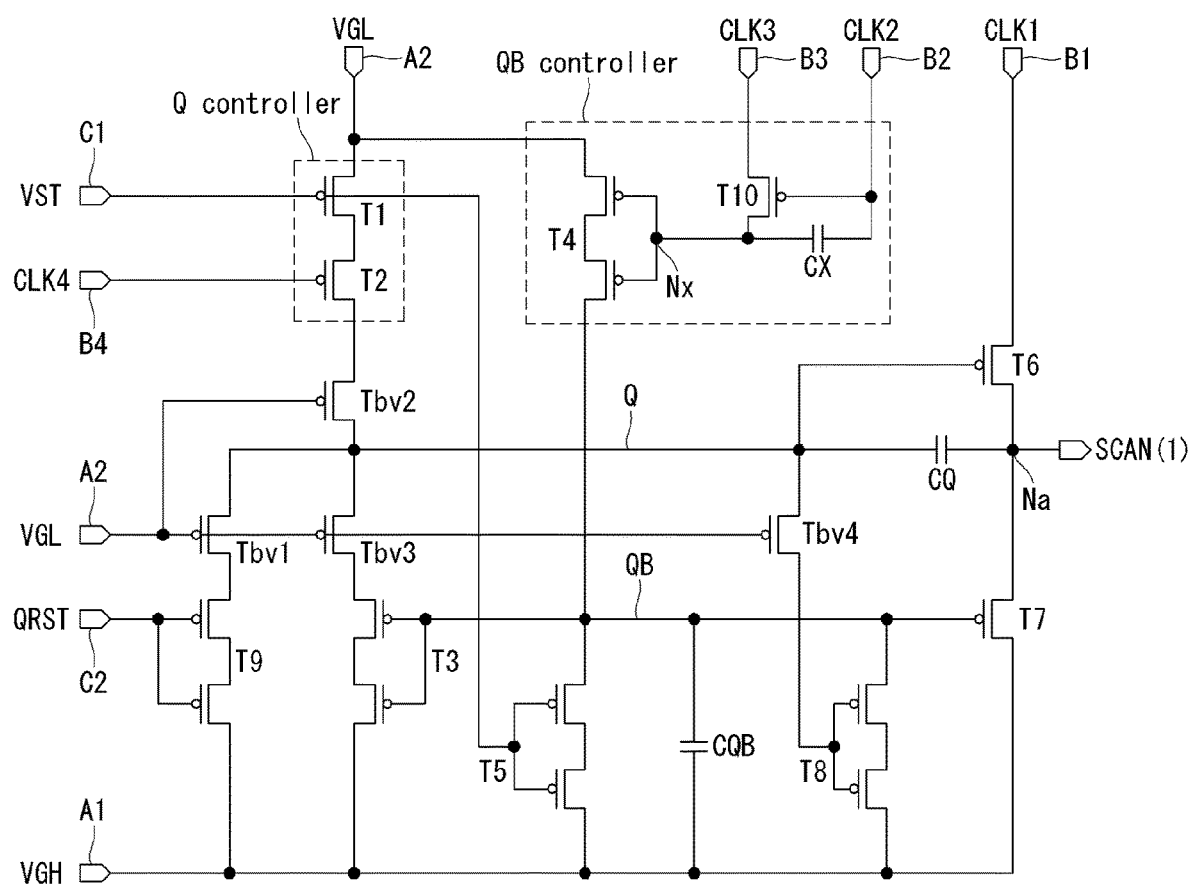

FIG. 8 illustrates another connection configuration of the stage shown in FIG. 6 according to an embodiment of the disclosure. More specifically, FIG. 8 illustrates the uppermost stage ST1 shown in FIG. 6. Configuration of each of the remaining stages ST2, ST3, ST4, . . . of FIG. 6 may be substantially the same as configuration of the uppermost stage ST1 of FIG. 8, except a difference in the clock signals and the carry signal.

Configuration of the stage ST1 shown in FIG. 8 is substantially the same as the configuration of the stage ST1 shown in FIG. 7, except the QB controller. Thus, duplicative description will be omitted for brevity.

In the stage ST1 shown in FIG. 8, a QB controller controls turn-on timing of a transistor T4 in response to two clock signals CLK2 and CLK3 in an overlap drive, thereby removing a current path interval in which the voltage of the node Q and the voltage of the node QB are unstable. In particular, the QB controller further includes a capacitor CX and secures operation stability of the transistor T4.

To this end, the QB controller includes a transistor T10 connected to a gate electrode of the transistor T4. The transistor T4 controls a current flow between the power terminal A2 and the node QB in response to the clock signal CLK3 applied to a node Nx. The gate electrode of the transistor T4 is connected to the node Nx, a first electrode of the transistor T4 is connected to the power terminal A2, and a second electrode of the transistor T4 is connected to the node QB. The transistor T10 applies the clock signal CLK3 to the node Nx in response to the clock signal CLK2. A gate electrode of the transistor T10 is connected to the clock terminal B2, a first electrode of the transistor T10 is connected to the clock terminal B3, and a second electrode of the transistor T10 is connected to the node Nx. The capacitor CX is connected to the node Nx and the clock terminal B2, in order to stabilize a gate voltage of the transistor T4.

As described above, the QB controller further receives the clock signal CLK2 in addition to the clock signal CLK3 and is operated. In this instance, as shown in FIG. 11, because the gate-on voltage period of the clock signal CLK2 partially overlaps the gate-on voltage period of the clock signal CLK3 and does not overlap the gate-on voltage period of the clock signal CLK4 controlling turn-on timing of a transistor T2, the current path interval, in which both the node Q and the node QB are simultaneously activated to the gate-on voltage VGL, can be removed. Further, an operation of the transistor T4 can be further stabilized by the capacitor CX.

Figure 9:
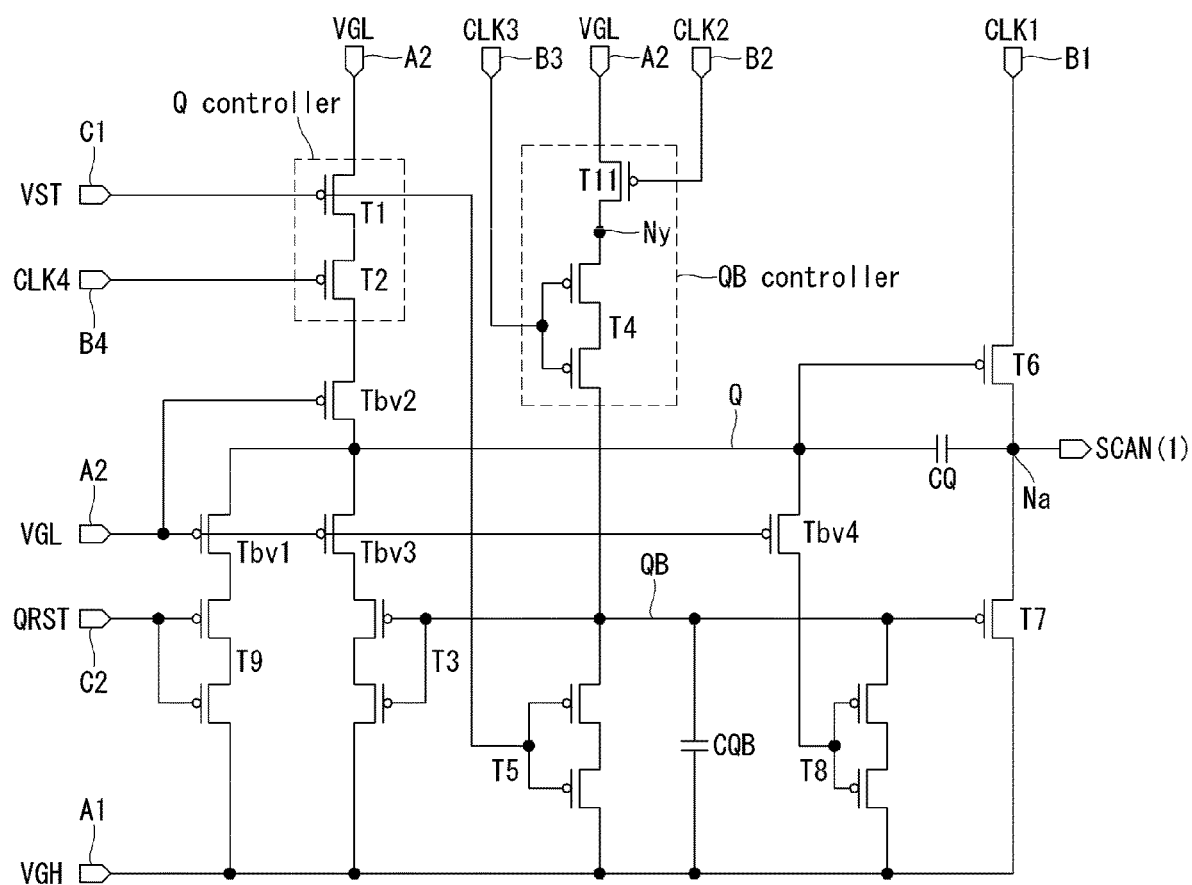

FIG. 9 illustrates another connection configuration of the stage shown in FIG. 6 according to an embodiment of the disclosure. More specifically, FIG. 9 illustrates the uppermost stage ST1 shown in FIG. 6. Configuration of each of the remaining stages ST2, ST3, ST4, . . . of FIG. 6 may be substantially the same as configuration of the uppermost stage ST1 of FIG. 9, except a difference in the clock signals and the carry signal.

Configuration of the stage ST1 shown in FIG. 9 is substantially the same as the configuration of the stage ST1 shown in FIG. 7, except the QB controller. Thus, duplicative description will be omitted for brevity.

In the stage ST1 shown in FIG. 9, a QB controller controls turn-on timing of a transistor T4 in response to two clock signals CLK2 and CLK3 in an overlap drive, thereby removing a current path interval in which the voltage of the node Q and the voltage of the node QB are unstable.

To this end, the QB controller includes a transistor T11 and the transistor T4 that are connected in series between the power terminal A2 and the node QB. A gate electrode of the transistor T11 is connected to the clock terminal B2, a first electrode of the transistor T11 is connected to the power terminal A2, and a second electrode of the transistor T11 is connected to a node Ny. A gate electrode of the transistor T4 is connected to the clock terminal B3, a first electrode of the transistor T4 is connected to the node Ny, and a second electrode of the transistor T4 is connected to the node QB. FIG. 9 illustrates that the transistor T11 is connected between the power terminal A2 and the transistor T4, by way of example. However, the transistor T4 may be connected between the power terminal A2 and the transistor T11. In this instance, the gate electrode of the transistor T4 is connected to the clock terminal B3, the first electrode of the transistor T4 is connected to the power terminal A2, and the second electrode of the transistor T4 is connected to the node Ny. The gate electrode of the transistor T11 is connected to the clock terminal B2, the first electrode of the transistor T11 is connected to the node Ny, and the second electrode of the transistor T11 is connected to the node QB.

As described above, the QB controller further receives the clock signal CLK2 in addition to the clock signal CLK3 and is operated. In this instance, as shown in FIG. 11, because the gate-on voltage period of the clock signal CLK2 partially overlaps the gate-on voltage period of the clock signal CLK3 and does not overlap the gate-on voltage period of the clock signal CLK4 controlling turn-on timing of a transistor T2, the current path interval, in which both the node Q and the node QB are simultaneously activated to the gate-on voltage VGL, can be removed.

Figure 10:
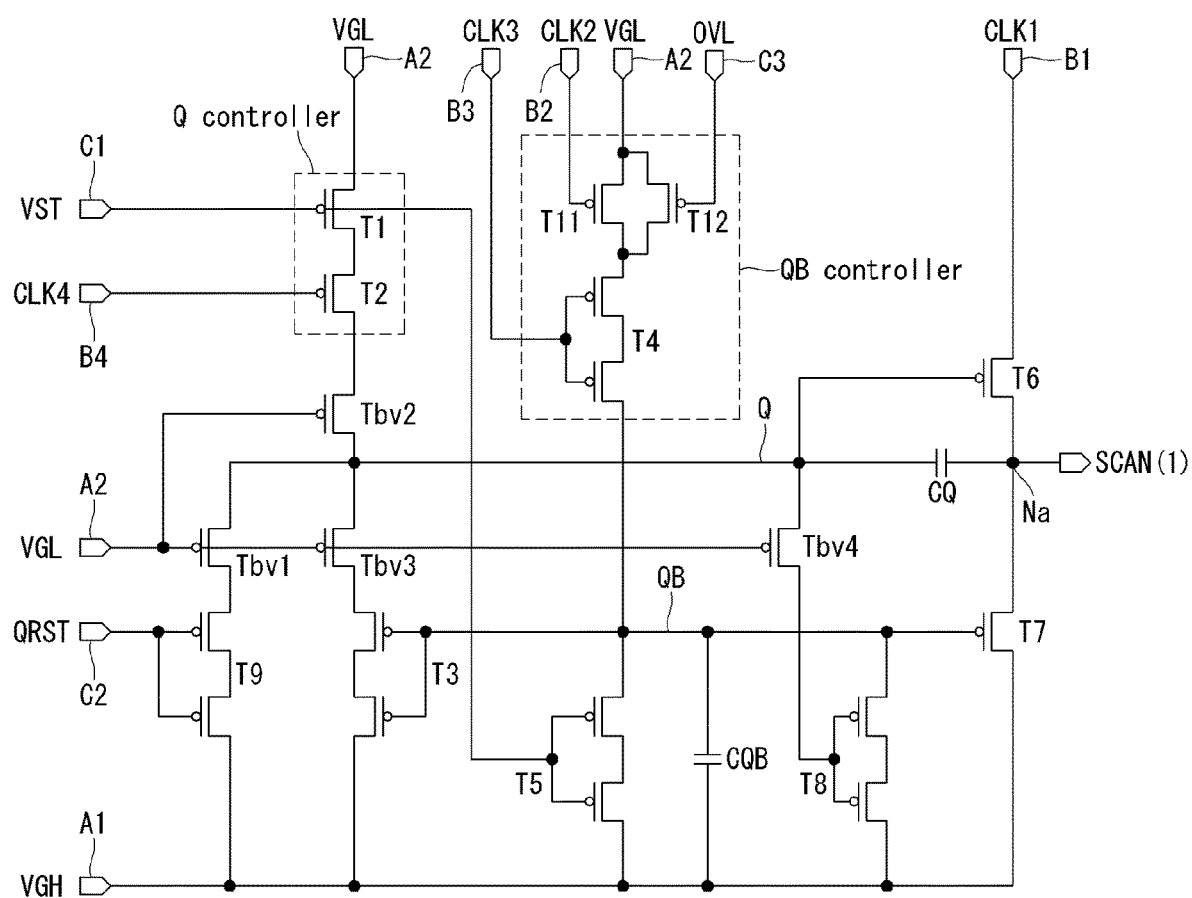

FIG. 10 illustrates another connection configuration of the stage shown in FIG. 6 according to an embodiment of the disclosure. More specifically, FIG. 10 illustrates the uppermost stage ST1 shown in FIG. 6. Configuration of each of the remaining stages ST2, ST3, ST4, . . . of FIG. 6 may be substantially the same as configuration of the uppermost stage ST1 of FIG. 10, except a difference in the clock signals and the carry signal.

Configuration of the stage ST1 shown in FIG. 10 is substantially the same as the configuration of the stage ST1 shown in FIG. 7, except the QB controller. Thus, duplicative description will be omitted for brevity.

In the stage ST1 shown in FIG. 10, a QB controller controls a timing, at which the node QB is activated to the gate-on voltage VGL, in response to two clock signals CLK2 and CLK3 in an overlap drive, thereby removing a current path interval in which the voltage of the node Q and the voltage of the node QB are unstable.

To this end, the QB controller includes a transistor T11 and a transistor T4 that are connected in series between the power terminal A2 and the node QB. A gate electrode of the transistor T11 is connected to the clock terminal B2, a first electrode of the transistor T11 is connected to the power terminal A2, and a second electrode of the transistor T11 is connected to a node Ny. A gate electrode of the transistor T4 is connected to the clock terminal B3, a first electrode of the transistor T4 is connected to the node Ny, and a second electrode of the transistor T4 is connected to the node QB. FIG. 10 illustrates that the transistor T11 is connected between the power terminal A2 and the transistor T4, by way of example. However, the transistor T4 may be connected between the power terminal A2 and the transistor T11. In this instance, the gate electrode of the transistor T4 is connected to the clock terminal B3, the first electrode of the transistor T4 is connected to the power terminal A2, and the second electrode of the transistor T4 is connected to the node Ny. The gate electrode of the transistor T11 is connected to the clock terminal B2, the first electrode of the transistor T11 is connected to the node Ny, and the second electrode of the transistor T11 is connected to the node QB.

As described above, the QB controller further receives the clock signal CLK2 in addition to the clock signal CLK3 and is operated. In this instance, as shown in FIG. 11, because the gate-on voltage period of the clock signal CLK2 partially overlaps the gate-on voltage period of the clock signal CLK3 and does not overlap the gate-on voltage period of the clock signal CLK4 controlling turn-on timing of a transistor T2, the current path interval, in which both the node Q and the node QB are simultaneously activated to the gate-on voltage VGL, can be removed.

Figure 12:
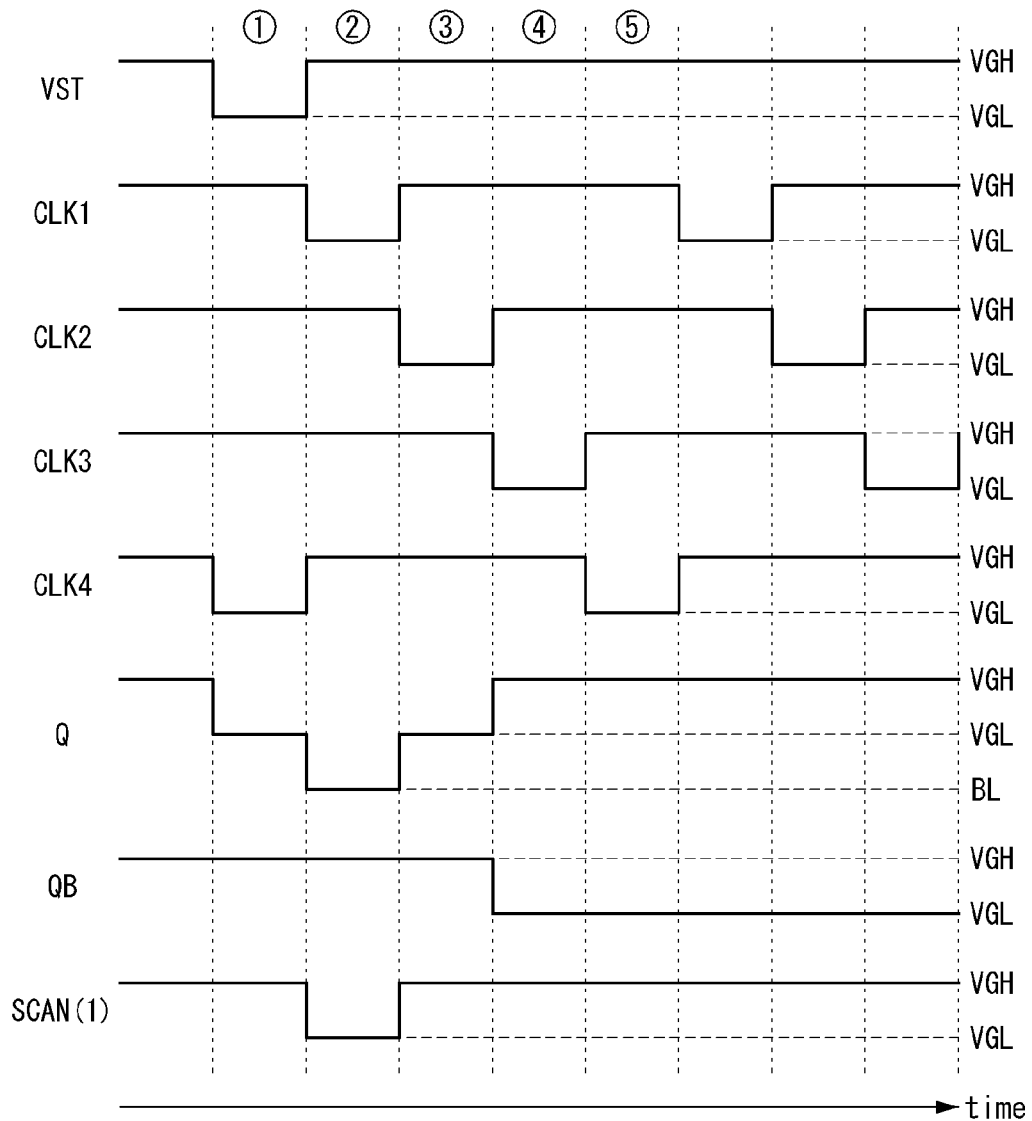
FIG. 12 illustrates an operation waveform of a stage in accordance with a non-overlap drive according to an embodiment of the disclosure.

The QB controller may further include a transistor T12 that is connected in parallel to the transistor T11 and is turned on or off in response to an overlap control signal OVL. The overlap control signal OVL is input at a turn-on level in a non-overlap drive and is input at a turn-off level in the overlap drive. The overlap drive allows gate-on voltage periods of adjacent scan signals to partially overlap one another using clock signals which overlap one another by a predetermined phase as shown in FIG. 11. The non-overlap drive allows gate-on voltage periods of scan signals not to overlap one another using clock signals, of which gate-on voltage periods do not overlap as shown in FIG. 12. The overlap drive or the non-overlap drive may be determined depending on a length of the initialization period A and a length of the sampling period B of FIG. 4. For example, because a length of the initialization period A and a length of the sampling period B are short in a high resolution display device, a sufficient time can be ensured through the overlap drive. When the stages are configured as shown in FIG. 10, the overlap drive or the non-overlap drive can be easily selected. Thus, embodiments of the disclosure can easily accommodate various models and specifications of display devices.

In the overlap drive, the transistor T12 is turned off, and an operation of the QB controller is as described above.

In the non-overlap drive, the transistor T12 is turned on, and turn-on timing of the transistor T4 is controlled by the clock signal CLK3 irrespective of the clock signal CLK2. As shown in FIG. 12, because the gate-on voltage period of the clock signal CLK3 does not overlap the gate-on voltage period of the clock signal CLK4 controlling the turn-on timing of the transistor T2, the current path interval, in which both the node Q and the node QB are simultaneously activated to the gate-on voltage VGL, can be removed.

FIG. 11 illustrates an operation waveform of a stage in accordance with an overlap drive according to an embodiment of the disclosure. FIGS. 13A to 13E illustrate operation states of a stage respectively corresponding to periods ① to ⑤ shown in FIG. 11 according to an embodiment of the disclosure. In FIG. 11, "1H" indicates one horizontal period allocated to drive one horizontal pixel line. In the periods ① to ⑤ shown in FIG. 11, the global reset signal QRST is continuously input at the gate-off voltage VGL.

Figure 13A:
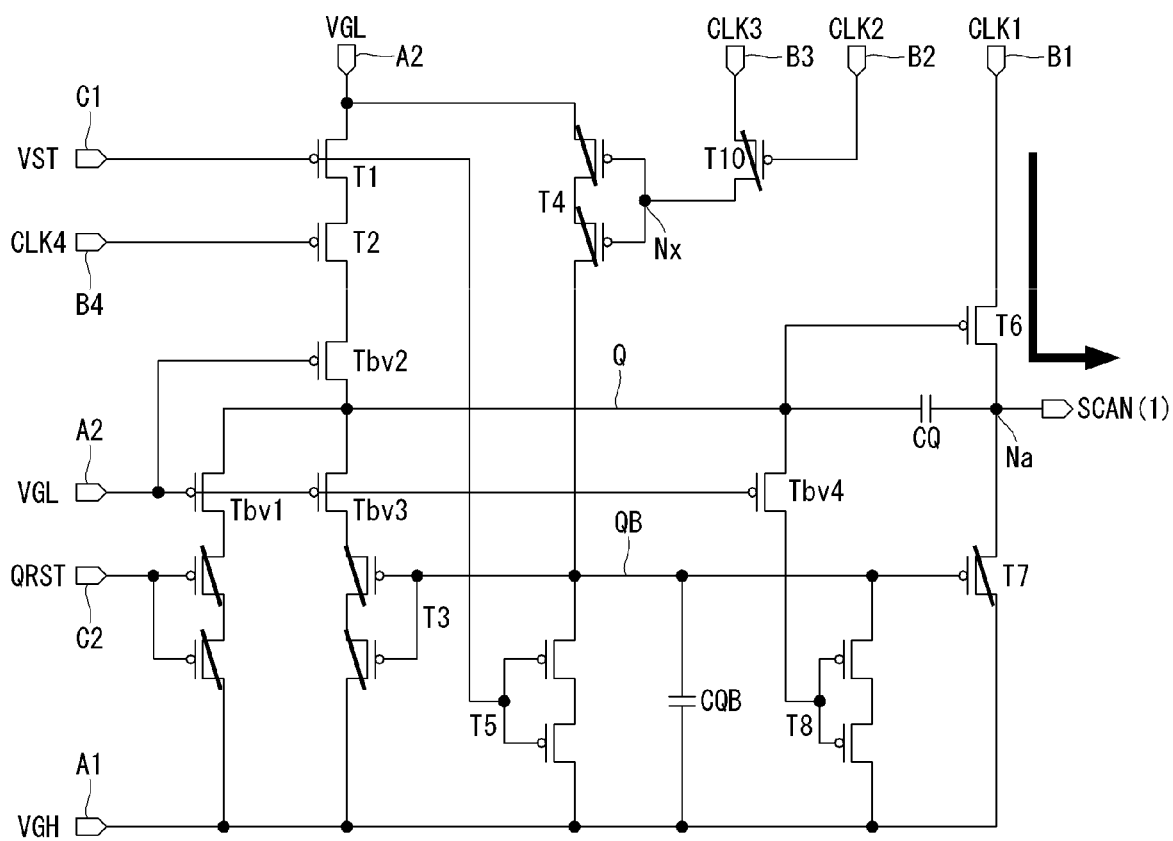
FIGS. 13A to 13E illustrate operation states of a stage respectively corresponding to periods ① to ⑤ shown in FIG. 11 according to an embodiment of the disclosure.

Referring to FIGS. 11 and 13A, in the period ①, the start signal VST and the clock signals CLK3 and CLK4 are input at the gate-on voltage VGL, and the clock signals CLK1 and CLK2 are input at the gate-off voltage VGH.

In the period ①, the transistors T1 and T5 are turned on in response to the start signal VST of the gate-on voltage VGL, and the transistor T2 is turned on in response to the clock signal CLK4 of the gate-on voltage VGL. Further, the transistors T10 and T4 are turned on in response to the clock signal CLK2 of the gate-off voltage VGH.

In the period ①, the transistors Tbv1, Tbv2, Tbv3 and Tbv4 maintain an on-state.

In the period ①, the transistors T1 and T2 are turned on in response to the start signal VST of the gate-on voltage VGL and the clock signal CLK4 of the gate-on voltage VGL, and the node Q is activated to the gate-on voltage VGL. The transistors T6 and T8 are turned on by the gate-on voltage VGL of the node Q. Thus, the clock signal CLK1 of the gate-off voltage VGH as the scan signal SCAN(1) is output to the node Na due to the turn-on of the transistor T6.

In the period ①, the transistor T8 is turned on by the gate-on voltage VGL of the node Q, and the transistor T5 is turned on in response to the start signal VST of the gate-on voltage VGL. Therefore, the node QB is deactivated to the gate-off voltage VGH, and the transistors T3 and T7 are turned off.

Figure 13B:
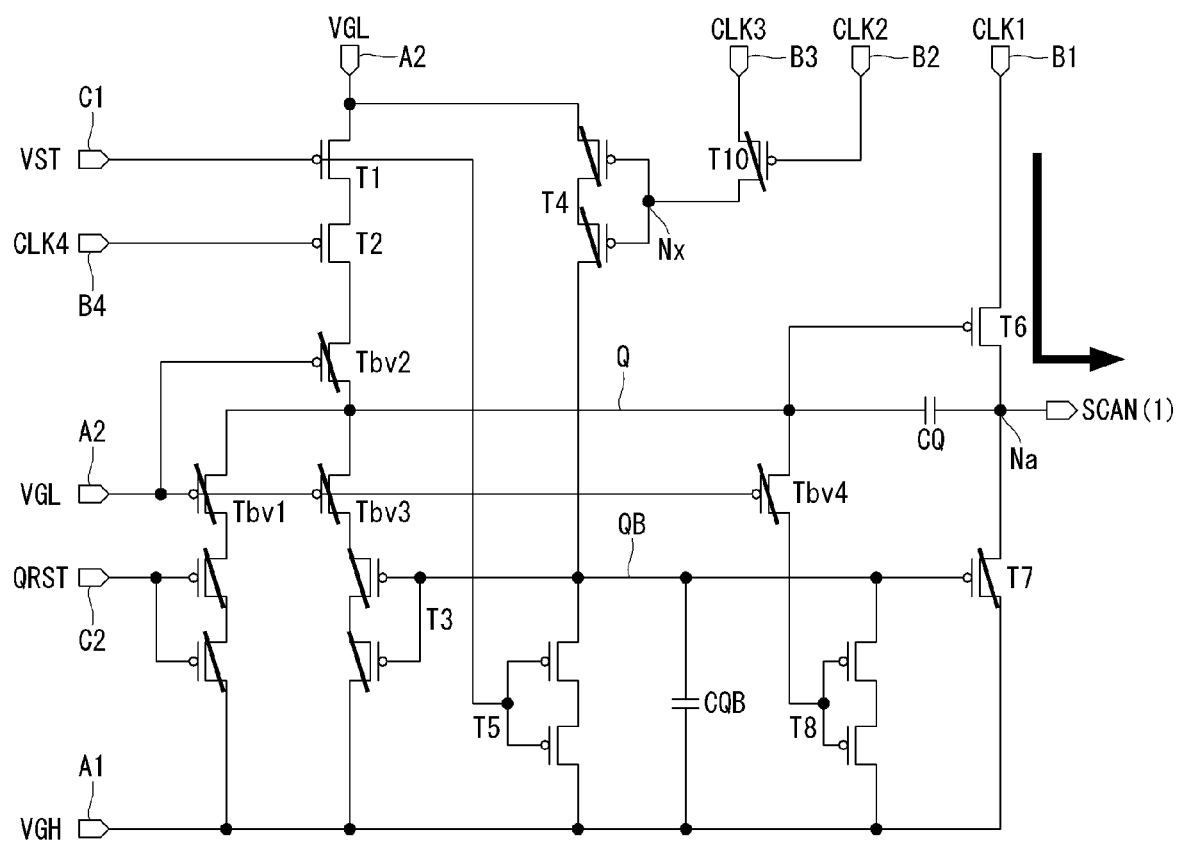

Referring to FIGS. 11 and 13B, in the period ②, the start signal VST and the clock signals CLK1 and CLK4 are input at the gate-on voltage VGL, and the clock signals CLK2 and CLK3 are input at the gate-off voltage VGH.

In the period ②, the transistors T1 and T5 maintain an on-state in response to the start signal VST of the gate-on voltage VGL, and the transistor T2 maintains an on-state in response to the clock signal CLK4 of the gate-on voltage VGL. Further, the transistor T4 maintains an off-state in response to the clock signals CLK2 and CLK3 of the gate-off voltage VGH.

In the period ②, the clock signal CLK1 is inverted from the gate-off voltage VGH to the gate-on voltage VGL and is input to the clock terminal B1. When the voltage of the clock terminal B1 is reduced from the gate-off voltage VGH to the gate-on voltage VGL due to a coupling effect of a parasitic capacitor existing between the clock terminal B1 and the node Q, the voltage of the node Q is reduced from the gate-on voltage VGL to a boosting voltage BL. As a result, the clock signal CLK1 of the gate-on voltage VGL is charged to the node Na through the transistor T6 without the delay and the distortion. In other words, the scan signal SCAN(1) of the gate-on voltage VGL is rapidly output to the node Na.

In the period ②, as the voltage of the node Q is reduced from the gate-on voltage VGL to the boosting voltage BL, the transistors Tbv1, Tbv2, Tbv3 and Tbv4 are turned off. The transistors Tbv1, Tbv2, Tbv3 and Tbv4 are turned off while the voltage of the node Q is boosted, and blocks an overload from being applied to the transistors T2, T3, T8 and T9.

In the period ②, the gate electrode of the transistor T8 is floated, the transistor T8 maintains an on-state, and the transistors T4 and T10 maintain an off-state in response to the clock signals CLK2 and CLK3 of the gate-off voltage VGH. Therefore, the node QB holds the gate-off voltage VGH, and the transistors T3 and T7 maintain an off-state.

Figure 13C:
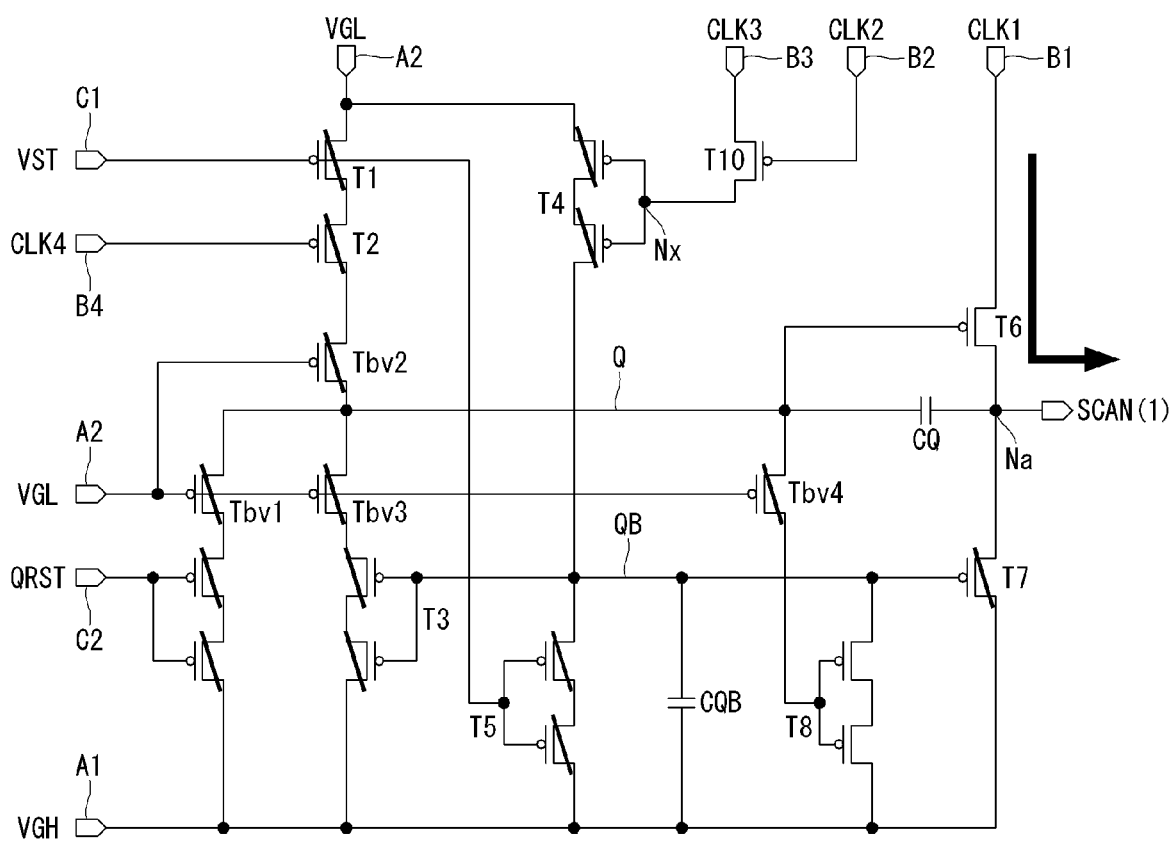

Referring to FIGS. 11 and 13C, in the period ③, the start signal VST and the clock signals CLK3 and CLK4 are input at the gate-off voltage VGH, and the clock signals CLK1 and CLK2 are input at the gate-on voltage VGL.

In the period ③, the transistors T1 and T5 maintain an off-state in response to the start signal VST of the gate-off voltage VGH, and the transistor T2 is turned off in response to the clock signal CLK4 of the gate-off voltage VGH. Further, the transistor T10 is turned on in response to the clock signal CLK2 of the gate-on voltage VGL, and the transistor T4 maintains an off-state in response to the clock signal CLK3 of the gate-off voltage VGH.

In the period ③, the node Q is floated. Because the voltage of the clock terminal B1 is held at the gate-on voltage VGL in the period ③, the voltage of the node Q is held at the boosting voltage BL. Further, the transistors Tbv1, Tbv2, Tbv3 and Tbv4 maintain an off-state, and the transistors T6 and T8 maintain an on-state. As a result, the scan signal SCAN(1) of the gate-on voltage VGL is output to the node Na through the transistor T6.

Figure 13D:
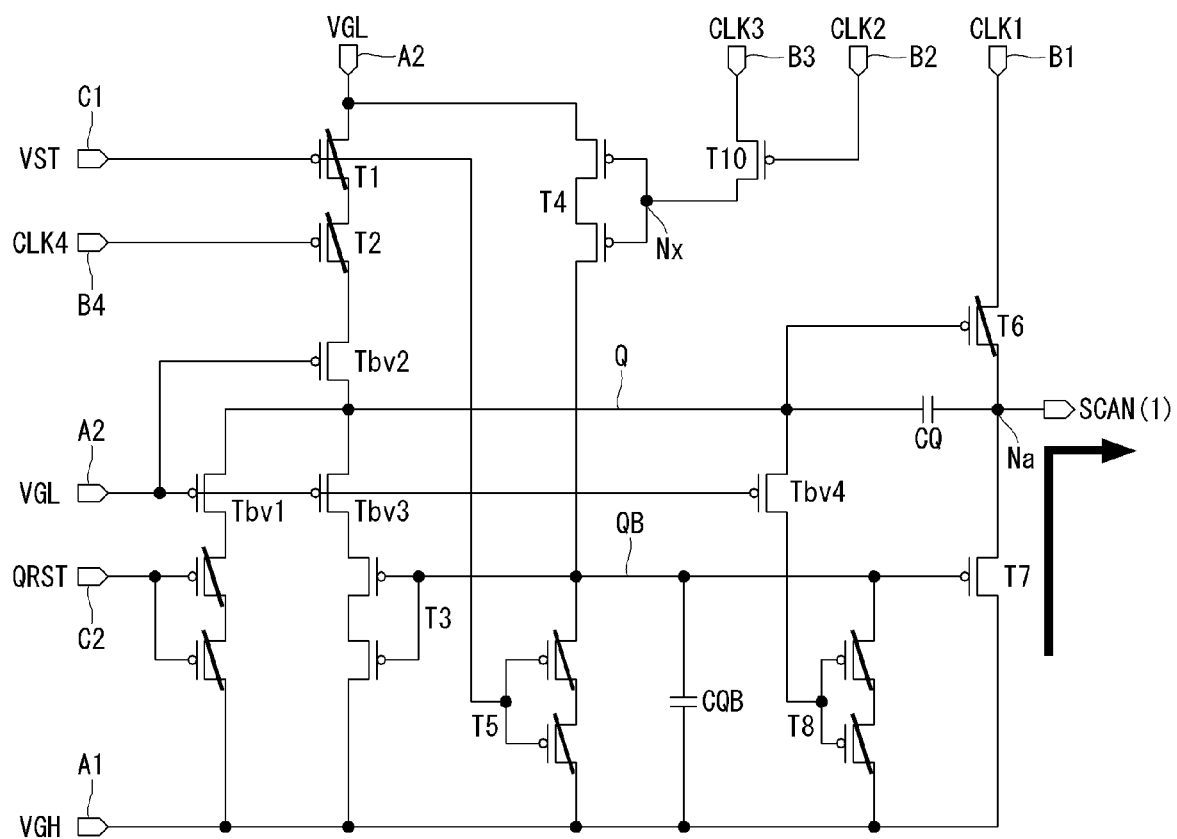

Referring to FIGS. 11 and 13D, in the period ④, the start signal VST and the clock signals CLK4 and CLK1 are input at the gate-off voltage VGH, and the clock signals CLK2 and CLK3 are input at the gate-on voltage VGL.

In the period ④, the transistors T1 and T5 maintain an off-state in response to the start signal VST of the gate-off voltage VGH, and the transistor T2 maintains an off-state in response to the clock signal CLK4 of the gate-off voltage VGH. Further, the transistors T4 and T10 are turned on in response to the clock signals CLK2 and CLK3 of the gate-on voltage VGL.

In the period ④, the gate-on voltage VGL is applied to the node QB due to the turn-on of the transistor T4. Further, the transistors T7 and T3 are turned on by the node QB of the gate-on voltage VGL. As a result, the scan signal SCAN(1) of the gate-off voltage VGH is output to the node Na through the transistor T7, and the gate-off voltage VGH is applied to the node Q through the transistor T3.

In the period ④, the voltage of the node Q is inverted to the gate-off voltage VGH, and the transistors Tbv1, Tbv2, Tbv3 and Tbv4 are turned on. Further, the transistor T6 is turned off by the node Q of the gate-off voltage VGH.

Figure 13E:
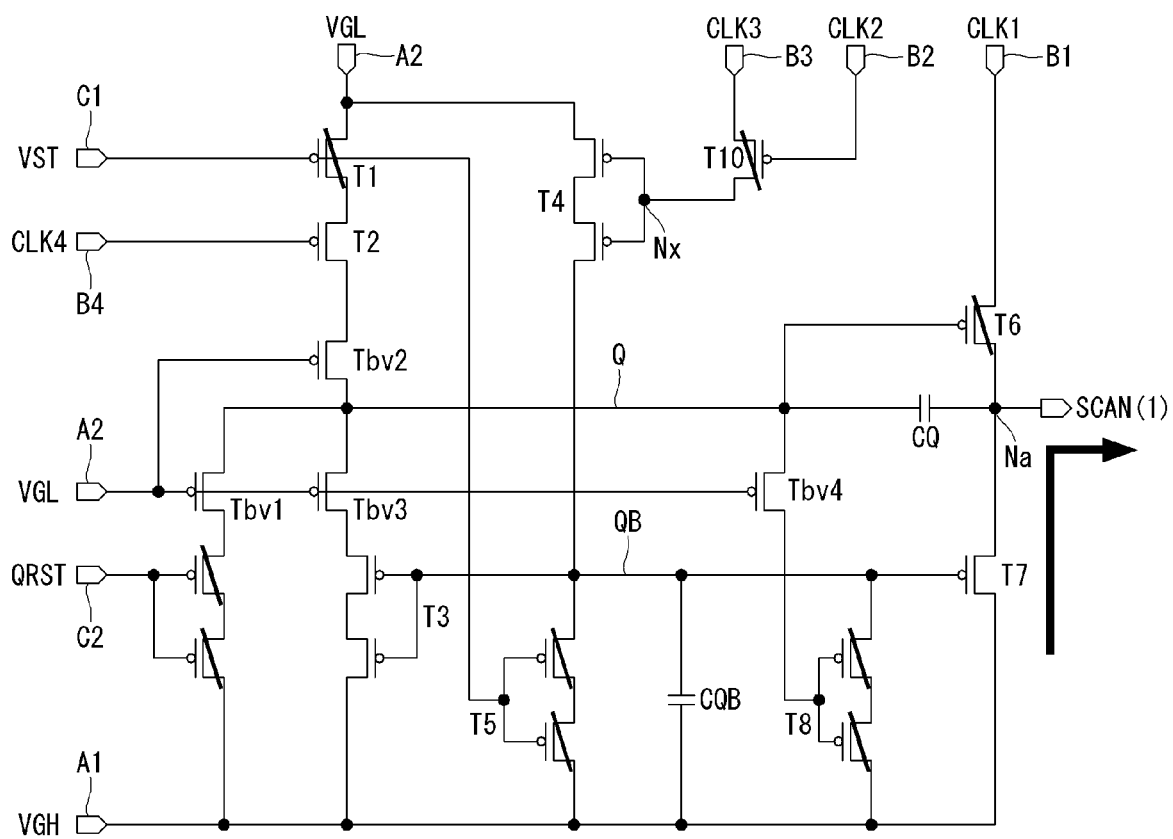

Referring to FIGS. 11 and 13E, in the period ⑤, the start signal VST and the clock signals CLK1 and CLK2 are input at the gate-off voltage VGH, and the clock signals CLK3 and CLK4 are input at the gate-on voltage VGL.

In the period ⑤, the transistors T1 and T5 maintain an off-state in response to the start signal VST of the gate-off voltage VGH, and the transistor T2 is turned on in response to the clock signal CLK4 of the gate-on voltage VGL. Further, the transistor T10 is turned off in response to the clock signal CLK2 of the gate-off voltage VGH, and the node Nx is floated. Because the node Nx is held at the gate-on voltage VGL, the transistor T4 maintains an on-state.

In the period ⑤, the gate-on voltage VGL is continuously applied to the node QB via the transistor T4, and the transistors T7 and T3 maintain an on-state by the node QB of the gate-on voltage VGL. As a result, the scan signal SCAN(1) of the gate-off voltage VGH is continuously output to the node Na through the transistor T7, and the gate-off voltage VGH is continuously applied to the node Q through the transistor T3.

In the period ⑤, because the voltage of the node Q is held at the gate-off voltage VGH, the transistors Tbv1, Tbv2, Tbv3 and Tbv4 are turned on. Further, the transistor T6 maintains an off-state by the node Q of the gate-off voltage VGH.

As described above, the embodiments of the disclosure control a timing, at which the node QB is activated, in response to the second and third clock signals, of which the gate-on voltage periods partially overlap each other, in the overlap drive and do not overlap the gate-on voltage period of the fourth clock signal for activating the node Q and the gate-on voltage period of the second clock signal, thereby removing the current path interval in which the voltage of the node Q and the voltage of the node QB are simultaneously activated. Thus, the embodiments of the disclosure can secure the operation stability and the operation reliability and reduce the power consumption by removing the current path interval in which the voltage of the node Q and the voltage of the node QB are unstable.

Although the embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gate driver comprising:
a plurality of stages, wherein each stage includes:
a first transistor configured to output a first clock signal as a scan signal in accordance with a first node;
a second transistor configured to output a gate-off voltage as the scan signal in accordance with a second node which is activated as opposed to the first node;
a first controller configured to activate the first node to a gate-on voltage in response to a start signal or a carry signal, of which a phase is earlier than a phase of the first clock signal, and a fourth clock signal, of which a phase is earlier than the phase of the first clock signal; and
a second controller configured to activate the second node to the gate-on voltage in response to a second clock signal, of which a phase is later than the phase of the first clock signal, and a third clock signal, of which a phase is later than the phase of the second clock signal,
wherein the second node is activated when the second clock signal and the third clock signal are maintained at the gate-on voltage.

2. The gate driver of claim 1, wherein the second controller includes:
a third transistor configured to apply the third clock signal to a third node in response to the second clock signal; and
a fourth transistor configured to control a current flow between an input terminal of the gate-on voltage and the second node in response to the third clock signal applied to the third node.

3. The gate driver of claim 2, wherein the second controller further includes a first capacitor connected between the third node and an input terminal of the second clock signal.

4. The gate driver of claim 1, wherein the second controller includes a fifth transistor and a fourth transistor that are connected in series between an input terminal of the gate-on voltage and the second node,
wherein a gate electrode of the fifth transistor is connected to an input terminal of the second clock signal, and a gate electrode of the fourth transistor is connected to an input terminal of the third clock signal.

5. The gate driver of claim 4, wherein the second controller further includes a sixth transistor that is connected in parallel to the fifth transistor and is turned on or off in response to an overlap control signal.

6. The gate driver of claim 1, wherein each of the first to fourth clock signals swings between the gate-on voltage and the gate-off voltage,
wherein gate-on voltage periods of the first and second clock signals partially overlap, gate-on voltage periods of the second and third clock signals partially overlap, gate-on voltage periods of the third and fourth clock signals partially overlap, and gate-on voltage periods of the fourth and first clock signals partially overlap,
wherein the gate-on voltage periods of the first and third clock signals do not overlap, and the gate-on voltage periods of the second and fourth clock signals do not overlap.

7. The gate driver of claim 5, wherein the sixth transistor maintains a turn-on state in response to the overlap control signal,
wherein each of the first to fourth clock signals swings between the gate-on voltage and the gate-off voltage, wherein gate-on voltage periods of the first to fourth clock signals do not overlap one another.

8. The gate driver of claim 1, wherein the first controller includes a seventh transistor and an eighth transistor that are connected in series between an input terminal of the gate-on voltage and the first node,
wherein a gate electrode of the seventh transistor is connected to a start terminal to which the start signal or the carry signal is input, and a gate electrode of the eighth transistor is connected to an input terminal of the fourth clock signal.

9. A gate driver comprising:
a plurality of stages each configured to receive a plurality of clock signals, of which phases partially overlap one another, and output a scan signal swinging between a gate-on voltage and a gate-off voltage, wherein each stage includes:
a first transistor configured to operate in response to a first node;
a second transistor configured to share an output node, to which the scan signal is output, with the first transistor and operate in response to a second node; and
a second controller configured to activate the second node to the gate-on voltage using two activation clock signals, of which gate-on voltage periods partially overlap each other, among the plurality of clock signals,
wherein the gate-on voltage period of one of the two activation clock signals does not overlap a gate-on voltage period of a first activation clock signal for activating the first node so that a current path interval, in which the first node and the second node are simultaneously activated, is removed,
wherein the second node is activated when the two activation clock signals are maintained in the gate-on voltage period.

10. The gate driver of claim 9, wherein the first activation clock signal is a fourth clock signal, and the two activation clock signals are a second clock signal and a third clock signal,
wherein the second to fourth clock signals each swing between the gate-on voltage and the gate-off voltage,
wherein gate-on voltage periods of the second and third clock signals overlap each other, and gate-on voltage periods of the third and fourth clock signals overlap each other,
wherein the gate-on voltage periods of the second and fourth clock signals do not overlap each other.

11. The gate driver of claim 10, wherein the second controller includes:
a fourth transistor including a gate electrode connected to a third node and configured to control a current flow between an input terminal of the gate-on voltage and the second node; and
a third transistor including a gate electrode connected to an input terminal of the second clock signal and configured to control a current flow between the third node and an input terminal of the third clock signal.

12. The gate driver of claim 11, wherein the second controller further includes a first capacitor connected between the third node and the input terminal of the second clock signal.

13. The gate driver of claim 10, wherein the second controller includes a fifth transistor and a fourth transistor that are connected in series between an input terminal of the gate-on voltage and the second node, wherein a gate electrode of the fifth transistor is connected to an input terminal of the second clock signal, and a gate electrode of the fourth transistor is connected to an input terminal of the third clock signal.

14. The gate driver of claim 13, wherein the second controller further includes a sixth transistor that is connected in parallel to the fifth transistor and is turned on or off in response to an overlap control signal.

15. The gate driver of claim 14, wherein when the sixth transistor maintains a turn-on state, the second controller activates the second node to the gate-on voltage in response to the third clock signal irrespective of the second clock signal.

16. The gate driver of claim 9, wherein each stage further includes a first controller configured to activate the first node to the gate-on voltage in response to a start signal or a carry signal input to a start terminal and the first activation clock signal.

17. The gate driver of claim 16, wherein the first controller includes a seventh transistor and an eighth transistor that are connected in series between an input terminal of the gate-on voltage and the first node,
wherein a gate electrode of the seventh transistor is connected to the start terminal, and a gate electrode of the eighth transistor is connected to an input terminal of the first activation clock signal.

18. A display device comprising:
a gate driver, the gate driver comprising:
a plurality of stages,
wherein each stage includes:
a first transistor configured to output a first clock signal as a scan signal in accordance with a first node;
a second transistor configured to output a gate-off voltage as the scan signal in accordance with a second node which is activated as opposed to the first node;
a first controller configured to activate the first node to a gate-on voltage in response to a start signal or a carry signal, of which a phase is earlier than a phase of the first clock signal, and a fourth clock signal, of which a phase is earlier than the phase of the first clock signal; and
a second controller configured to activate the second node to the gate-on voltage in response to a second clock signal, of which a phase is later than the phase of the first clock signal, and a third clock signal, of which a phase is later than the phase of the second clock signal,
wherein the second node is activated when the second clock signal and the third clock signal are maintained at the gate-on voltage.

* * * * *